United States Patent
Ichijo et al.

(10) Patent No.: US 8,004,040 B2
(45) Date of Patent: Aug. 23, 2011

(54) SEMICONDUCTOR DEVICE AND ITS MANUFACTURING METHOD

(75) Inventors: Hisao Ichijo, Kizugawa (JP); Alberto Adan, Ikoma (JP); Kazushi Naruse, Nara (JP); Atsushi Kagisawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 160 days.

(21) Appl. No.: 12/331,470

(22) Filed: Dec. 10, 2008

(65) Prior Publication Data

US 2009/0159970 A1 Jun. 25, 2009

(30) Foreign Application Priority Data

Dec. 20, 2007 (JP) ................................. 2007-328818

(51) Int. Cl.
*H01L 29/66* (2006.01)
(52) U.S. Cl. ................ 257/341; 257/401; 257/E29.258; 257/E29.12
(58) Field of Classification Search .................. 257/343, 257/335, 339, 341, 401, 409, E29.256–E29.258
See application file for complete search history.

(56) References Cited

U.S. PATENT DOCUMENTS

| | | | |
|---|---|---|---|
| 5,374,843 A | 12/1994 | Williams et al. | |
| 6,570,229 B1 * | 5/2003 | Harada | 257/373 |
| 7,109,562 B2 * | 9/2006 | Lee | 257/488 |
| 2002/0060341 A1 | 5/2002 | Terashima | |
| 2002/0066930 A1 | 6/2002 | Terashima | |
| 2003/0173624 A1 | 9/2003 | Choi et al. | |
| 2005/0199951 A1 | 9/2005 | Shimizu et al. | |
| 2007/0034985 A1 | 2/2007 | Matsudai et al. | |
| 2009/0065862 A1 | 3/2009 | Matsudai et al. | |

FOREIGN PATENT DOCUMENTS

| | | |
|---|---|---|
| JP | 7-50413 | 2/1995 |
| JP | 2002-26315 A | 1/2002 |
| JP | 2002-158348 A | 5/2002 |
| JP | 2002-170952 A | 6/2002 |
| JP | 2004-022769 | 1/2004 |
| JP | 2004-281864 A | 10/2004 |
| JP | 2005-129561 A | 5/2005 |
| JP | 2006-237222 A | 9/2006 |
| JP | 2007-049039 A | 2/2007 |
| JP | 2007-088334 A | 4/2007 |
| JP | 2007-226656 | 9/2007 |

* cited by examiner

*Primary Examiner* — Matthew Smith
*Assistant Examiner* — Quovaunda Jefferson
(74) *Attorney, Agent, or Firm* — Nixon & Vanderhye P.C.

(57) ABSTRACT

Provided are a semiconductor device which can be manufactured at low cost and has a low on-resistance and a high withstand voltage, and its manufacturing method. The semiconductor device comprises an N-type well area formed on a P-type semiconductor substrate, a P-type body area formed within the well area, an N-type source area formed within the body area, an N-type drain area formed at a distance from the body area within the well area, a gate insulating film formed so as to overlay a part of the body area, a gate electrode formed on the gate insulating film and a P-type buried diffusion area which makes contact with the bottom of the body area and extends to an area beneath the drain area in a direction parallel to the surface of the semiconductor substrate within the well area.

8 Claims, 22 Drawing Sheets

SEMICONDUCTOR DEVICE AND ITS MANUFACTURING METHOD

CROSS REFERENCE TO RELATED APPLICATION

This Nonprovisional application claims priority under 35 U.S.C. §119(a) on Patent Application No. 2007-328818 filed in Japan on Dec. 20, 2007, the entire contents of which are hereby incorporated by reference.

BACKGROUND OF THE INVENTION

1. Field of the Invention

The present invention relates to a semiconductor device and its manufacturing method, and in particular, to an LDMOS transistor (lateral double-diffusion MOS transistor) and its manufacturing method.

2. Description of the Related Art

There are various applications for semiconductor devices with such circuits as switching regulators and DC/DC converters, and therefore, it has become necessary to increase the output current of semiconductor devices. Thus, LDMOS transistors having a low on-resistance have been drawing attention as possible means to improve the performance of the output current.

LDMOS transistors have a configuration where impurities of a different conductivity type from diffusion areas formed on the surface of a semiconductor substrate are diffused so as to form new diffusion areas and the difference in the length of diffusion in the lateral direction of these diffusion areas is used as the effective channel length. In this configuration, a short channel is formed, and therefore, the structure is appropriate for lowering the on-resistance and increasing the withstand voltage of the drain, as well as for use in various types of drivers, such as LCD drivers, and power supply circuits, and thus, LDMOS transistors have become a key device in fields requiring high power and high withstand voltage.

In general, the performance of LDMOS transistors is measured by the withstand voltage (breakdown voltage) and the on-resistance when turned off. However, there are generally tradeoffs between these two factors, and it is difficult to gain both a high withstand voltage and a low on-resistance at the same time. Therefore, long years of effort have been made to develop an LDMOS transistor where these two factors are both excellent.

The conventional LDMOS transistor described in Japanese Unexamined Patent Publication No. 2004-22769 (hereinafter referred to as well-known Document 1) will be described below with reference to FIG. 19. FIG. 19 is a schematic cross-sectional diagram showing the structure of an N-channel LDMOS transistor formed on a P-type semiconductor substrate.

As shown in FIG. 19, a conventional N-channel LDMOS transistor 100 is provided with a P-type body area 3 and an N-type drift area 5 formed in a position at a distance from this body area 3 in a plane within a P-type semiconductor substrate 1, and furthermore, a high concentration P-type buried diffusion area 4 is formed so as to make contact with the bottom of the body area 3. In addition, the buried diffusion area 4 is formed through implantation under such conditions that the area is buried inside the drift area 5.

An N-type source area 6 and a P-type body contact area 7 having a higher concentration than the body area 3 are formed within the body area 3, and an N-type drain area 8 having a higher concentration than the drift area 5 is formed within the drift area 5. A field oxide film 11 is formed on the drift area 5 so that the drain area 8 and an active area in the drift area 5 are separated. In addition, a gate insulating film 12 is formed so as to cover from the end portion of the source area 6 on the drain side to the end portion of the field oxide film 11 on the source side, and a gate electrode 9 is formed on this gate insulating film 12 and a part of the field insulating film 11.

In addition, a source electrode 6a is formed on the source area 6 and the body contact area 7 so that the source area 6 and the body 3 are electrically connected to the same potential by means of this source electrode 6a. Meanwhile, a drain electrode 8a is formed on the drain area 8.

In the case where the withstand voltage of a general N-channel LDMOS transistor is measured when the transistor is turned off, the source electrode 6a and the gate electrode 9 are set to the GND potential and a positive voltage is applied to the drain electrode 8a. At this time, a reverse bias is applied across the drain area 8 and the source area 6. When a reverse bias is applied between a drain and a source, the electrical field within a depletion layer becomes critical field at a certain voltage, so that avalanche breakdown is caused and a current suddenly starts flowing between the drain and the source. The voltage applied at this time corresponds to the withstand voltage value for the transistor.

FIG. 20 is a schematic cross-sectional diagram showing the structure of a conventional LDMOS transistor in the case where no buried diffusion area 4 as in FIG. 19 is formed. In the conventional LDMOS transistor 101 in FIG. 20, when a reverse bias is applied across the drain and the source, an electrical field is concentrated at the edge of the gate on the drain side (area A in FIG. 20), causing the withstand voltage to lower. Accordingly, it becomes important to mitigate the electrical field at the edge of the gate, in order to increase the withstand voltage. When the electrical field is concentrated in the vicinity of the edge of the gate, a slight amount of charge remains in the gate insulating film, and thus, there is a problem in terms of the reliability, and therefore, it is important to mitigate the electrical field at the edge of the gate, in order to increase the reliability of the transistor.

Thus, in the conventional LDMOS transistor 100 shown in FIG. 19, a buried diffusion area 4 is formed through implantation with higher concentration than in the drift area 5 and with high energy, and provided so as to make contact with the bottom of the body area 3 and be buried within the drift area 5.

In the configuration shown in FIG. 19, when a reverse bias is applied across the drain and the source, a depletion layer extends from the interface in which the P-type buried diffusion area 4 and the N-type drift area 5 are joined. Here, the buried diffusion area 4 has a higher concentration than the drift area 5, and therefore, the depletion layer easily extends toward the drift area 5, and as a result, the entirety of the drift area 5 is substantially depleted. As a result, the electrical field can be sufficiently mitigated in the vicinity of the surface, including at the edge of the gate (area A), and therefore, the concentration in the drift area 5 can be set higher in the case where the same withstand voltage is secured, so that the tradeoff between the withstand voltage and the on-resistance in the device can be greatly lessened.

In addition, Japanese Unexamined Patent Publication No. 07-050413 (hereinafter referred to as well-known Document 2) discloses a method for lessening the tradeoff between the withstand voltage and the on-resistance in devices using an epitaxial layer. FIG. 21 is a schematic cross-sectional diagram showing the structure of the N-channel LDMOS transistor disclosed in well-known Document 2. Here, as the same components as those in FIG. 19 are denoted by the same symbols.

The LDMOS transistor 100a shown in FIG. 21 is provided with a P-type epitaxial layer 102 provided on a P-type semiconductor substrate 1, and a high concentration P-type buried diffusion area 4 formed in the interface between the P-type semiconductor substrate 1 and the P-type epitaxial layer 102.

A P-type body area 3 and a second P-type diffusion area 103 formed so as to provide an excellent electrical connection between the P-type body area 3 and the buried diffusion area 4 are provided within the P-type epitaxial layer 102, and furthermore, a drift area 5 is provided in a position at a distance from the body area 3 in a plane.

In addition, an N-type source area 6 and a body contact area 7 are formed within the body area 3 as with FIG. 19, and an N-type drain area 8 is formed within the drift area 5. In addition, a gate insulating film 12 is formed so as to cover from the end portion of the source area 6 on the drain side to the end portion of the drift area 5 on the source side, and a gate electrode 9 is formed on the gate insulating film 12.

In addition, a source electrode 6a is formed on the source area 6 and the body contact area 7, and the source area 6 and the body area 3 are electrically connected to the same potential by means of the source electrode 6a. Furthermore, a drain electrode 8a is formed on the drain area 8, and a gate plate 15 is formed between the source electrode 6a and the drain electrode 8a.

The LDMOS transistor 100a in FIG. 21 also has a high concentration P-type buried diffusion area 4 in order to mitigate the electrical field at the edge of the gate (A in the figure), as with the LDMOS transistor 100 in FIG. 19. In addition, the gate plate 15 further mitigates the electrical field, and therefore, in the case where the same withstand voltage is secured, the concentration of the drift area 5 can be set higher, so that the tradeoff between the withstand voltage and the on-resistance in the device can be greatly lessened.

In order to implement the LDMOS transistor described in well-known Document 1 (transistor 100 in FIG. 19), however, it is necessary to form a buried diffusion area 4 through implantation with high energy. In this case, the following problems arise.

FIGS. 22A and 22B are schematic cross-sectional diagrams showing the structure when the buried diffusion area 4 is formed by implanting P-type impurity ions with high energy.

When impurity ions are implanted in order to form the buried diffusion area 4, the implantation area is covered with a resist, so that only the implantation area is exposed and the non-implantation area is masked. FIG. 22A shows a case where the taper angle of the covering resist 16 is 90 degrees relative to the surface of the substrate, and FIG. 22B shows a case where the taper angle is less than 90 degrees, so that the side of the resist 16 is inclined.

In the case where impurity ions are implanted using a resist 16 formed with a taper angle of 90 degrees as a mask, as shown in FIG. 22A, the buried diffusion area 4 can be formed at a desired depth uniformly throughout the entirety of the implantation area. In contrast, when the taper angle is less than 90 degrees, as shown in FIG. 22B, the buried diffusion area 4 can be formed at a desired depth in the area where no resist 16 is formed (area G in the figure), while the buried diffusion area 4 is formed in an area shallower than the desired depth beneath the area where the inclined surface is formed on the resist 16 (area H in the figure). In such cases, as shown in FIG. 22B, a part of the buried diffusion area 4 (area H) rises toward the surface of the substrate.

A described above, the buried diffusion area 4 is formed of a high concentration P-type impurity diffusion area. Meanwhile, the drift area 5 is formed of an N-type impurity diffusion area. Therefore, when a part of the buried diffusion area 4 rises toward the surface, a high concentration P-type impurity diffusion area is formed in a direction approximately perpendicular to the surface of the substrate in the N-type drift area 5, and this area becomes of a high resistance state. Therefore, a problem arises, such that the on-properties when a voltage is applied to the gate electrode 9 greatly deteriorate. Here, although the case where the taper angle is less than 90 degrees, as in FIG. 22B, has been described, the same problems arise even in the case where the taper angle is greater than 90 degrees, that is, in the case where the resist 16 is formed in such a manner that the cross sectional area parallel to the surface of the substrate becomes smaller toward the bottom.

In addition, in the case where the taper angle is 90 degrees, that is, in the case where the resist 16 is formed so that the side is perpendicular to the surface of the substrate, as shown in FIG. 22A, the buried diffusion area 4 does not rise, and thus, there is no such problem as that described above. However, it is necessary to keep the taper angle of the resist 16 stable at 90 degrees during the manufacturing process, and many separate control mechanisms are required in order to do so. Furthermore, even with such control mechanisms, the taper angle in some cases does not remain 90 degrees for a long time, and thus, the structure shown in FIG. 22A is unstable and difficult to implement.

Meanwhile, in the case where the LDMOS transistor 100a described in well-known Document 2 is implemented as shown in FIG. 21, high concentration impurity ions are implanted in the vicinity of the surface of the semiconductor substrate 1 in advance, so that a diffusion area is formed, and after that, an epitaxial layer 102 is grown so that the diffusion area is buried in the epitaxial layer 102, and thus, a buried diffusion area 4 can be formed. Therefore, it is not necessary to implant ions under such conditions that the energy is high in order to form the buried diffusion area 4 at a predetermined depth. Accordingly, unlike in the case of well-known Document 1, high resistance is not provided within the drift area 5 by the rising part of the buried diffusion area 4.

In order to implement the LDMOS transistor described in well-known document 2, however, it is necessary to form an epitaxial layer 102 during the manufacturing process, and therefore, a special epitaxial manufacturing unit becomes necessary, and thus, there is a demerit in terms of the cost, such that the manufacture becomes more expensive.

SUMMARY OF THE INVENTION

The present invention has been made in view of the above problems, and an object thereof is to provide a semiconductor device which can be manufactured at low cost and has a low on-resistance and a high withstand voltage, as well as its manufacturing method.

In order to achieve the object, a semiconductor device according to the present invention is characterized as first characteristics by comprising: a well area of a second conductivity type formed on a semiconductor substrate of a first conductivity type, the second conductivity type being different from the first conductivity type; a body area of the first conductivity type formed within the well area; a source area of the second conductivity type formed within the body area; a drain area of the second conductivity type formed at a distance from the body area within the well area; a gate insulating film formed so as to overlay a part of the body area; a gate electrode formed on the gate insulating film; and a buried diffusion area of the first conductivity type which makes contact with the bottom of the body area and extends to an area beneath the drain area in the direction parallel to the surface of the semiconductor substrate within the well area.

In the configuration of the semiconductor device according to the first characteristics of the present invention, the buried diffusion area of the first conductivity type is formed so as to make contact with the bottom of the body area, and therefore, the electrical field can be mitigated in the vicinity of the surface, including in the edge portion of the gate electrode, as in the conventional configuration, when a reverse bias is applied. Therefore, in the case where the same withstand voltage is secured, the concentration of the drift area 5 can be set higher, and thus, the tradeoff between the withstand voltage and the on-resistance in the device can be greatly lessened.

In addition, unlike in the conventional configuration, the buried diffusion area is formed so as to extend to a portion beneath the drain area, and therefore, in the case where ions are implanted in order to form the buried diffusion area and even an end portion of the buried diffusion area rises as a result of the inclined resist for masking areas other than the implantation area, the end portion rises only within the drain area, and therefore, the end portion of the buried diffusion area does not rise within the area sandwiched between the drain area and the source area. Therefore, the buried diffusion area of the first conductivity type does not intervene in the well area of the second conductivity type formed between the drain area and the source area, and thus, the on-resistance can be greatly reduced in comparison with the prior art.

In addition, in the semiconductor device according to the present invention, the on-resistance can be greatly reduced irrespectively of the taper angle of the resist, and therefore, no control mechanism is necessary for keeping the taper angle stable at 90 degrees, unlike in the prior art, so that the on-resistance can be reduced and kept stable over a long period of time.

In addition to the first characteristics, the semiconductor device according to the present invention is characterized as second characteristics in that the body area is formed so as to be sandwiched between two drain areas formed at a distance from each other.

In addition to the first characteristics, the semiconductor device according to the present invention is characterized as third characteristics in that the body area is formed in annular form so as to surround the drain area.

In addition to the third characteristics, the semiconductor device according to the present invention is characterized as fourth characteristics in that the buried diffusion area is not formed beneath a potential setting area which is a part of the drain area.

In the case where the buried diffusion area is formed so as to divide the well area into upper and lower layers, the well area under the buried diffusion area becomes of a floating state. At this time, when a reverse bias is applied across the drain and the source, the well area under the buried diffusion area is fixed to approximately the same potential as the semiconductor substrate, and the equipotential lines are distributed between the buried diffusion area and the drain area, so that an electrical field is concentrated in the border portion between these two areas. Therefore, in the case where the withstand voltage in the border portion between the two areas is lower than in the edge portion of the gate, the withstand voltage lowers.

In contrast, in the configuration of the semiconductor device according to the fourth characteristics of the present invention, the buried diffusion area is not formed beneath the potential setting area which is a part of the drain area, and thus, the potential of the well area under the buried diffusion area can be set at the same potential as the drain area even in the case where the buried diffusion area is formed so as to divide the well area into upper and lower layers. Therefore, even in the case where a reverse bias is applied, the electrical field is not concentrated in the border portion between the buried diffusion area and the drain area, and thus, no such problem as those above arises, making it possible to achieve a high withstand voltage.

In addition to the third characteristics, the semiconductor device according to the present invention is characterized as fifth characteristics by further comprising an auxiliary diffusion area of the second conductivity type formed beneath the drain area, the auxiliary diffusion area being electrically connected to the drain area, wherein the bottom of the auxiliary diffusion area is deeper than the bottom of the buried diffusion area.

In the configuration of the semiconductor device according to the fifth characteristics of the present invention, the drain area and the well area under the buried diffusion area can be set to have the same electric potential via the auxiliary diffusion area even in the case where the buried diffusion area is formed so as to divide the well area into upper and lower layers. Therefore, the electrical field is not concentrated in the border portion between the buried diffusion area and the drain area when a reverse bias is applied even in the case where the buried diffusion area is formed so as to divide the well area into upper and lower layers, and thus, it becomes possible to achieve a high withstand voltage.

In addition to any one of the first to fifth characteristics, the semiconductor device according to the present invention is characterized as sixth characteristics by further comprising a drift area of the second conductivity type within the well area, the drift area having a higher concentration than the well area and being at a distance from the body area, wherein the drain area having a higher concentration than the drift area is formed within the drift area.

In addition to any one of the first to sixth characteristics, the semiconductor device according to the present invention is characterized as seventh characteristics in that a body contact area of the first conductivity type having a higher concentration than the body area is formed within the body area.

In order to achieve the object, a manufacturing method for a semiconductor device according to the present invention, the semiconductor device according to any one of the first to seventh characteristics of the present invention, is characterized as first characteristics by comprising steps of: forming the well area by implanting impurity ions of the second conductivity type into the semiconductor substrate; forming the body area by implanting impurity ions of the first conductivity type into the well area after the well area forming step; forming the buried diffusion area by implanting impurity ions of the first conductivity type so that the buried diffusion area extends beneath an area where a drain area is to be formed in a later step, after the body area forming step; forming the gate insulating film so as to overlay a part of the body area after the buried diffusion area forming step; forming the gate electrode on the gate insulating film; and forming the source area and the drain area by implanting impurity ions of the second conductivity type having a higher concentration than the impurity ions in the well area forming step into predetermined areas within the body area and the well area after the gate electrode forming step.

In accordance with the manufacturing method for a semiconductor device according to the first characteristics of the present invention, the buried diffusion area is formed so as to extend beneath the drain area, and therefore, a semiconductor device where a low on-resistance and a high withstand voltage can be achieved and kept stable during the manufacturing process can be manufactured irrespectively of the taper angle of the resist when impurity ions are implanted in the buried diffusion area forming step.

In addition to the first characteristics, the manufacturing method for a semiconductor device according to the present invention is characterized as second characteristics in that the step of forming the drain area includes forming two drain areas at a distance from each other so that the two drain areas sandwich the body area by implanting impurity ions of the second conductivity type into the well area outside the body area.

In addition to the first characteristics, the manufacturing method for a semiconductor device according to the present invention is characterized as third characteristics in that the body area forming step includes forming the body area in annular form by implanting impurity ions of the first conductivity type so that a non-implantation area is formed in an area surrounded by the body area, and the drain area is formed by implanting impurity ions of the second conductivity type into a part of the well area surrounded by the body area so that the drain area is surrounded by the body area.

In addition to the third characteristics, the manufacturing method for a semiconductor device according to the present invention is characterized as fourth characteristics in that the buried diffusion area is formed so that the buried diffusion area does not extend beneath a potential setting area which is a part of the area where the drain area is to be formed.

In accordance with the manufacturing method for a semiconductor device according to the fourth characteristics of the present invention, the potential of the well area under the buried diffusion area can be set at the same potential as the drain area even in the case where the buried diffusion area is formed so as to divide the well area into upper and lower layers. Therefore, the electrical field is not concentrated in the border portion between the buried diffusion area and the drain area even in the case where a reverse bias is applied, and thus, it becomes possible to achieve a high withstand voltage.

In addition to the third characteristics, the manufacturing method for a semiconductor device according to the present invention is characterized as fifth characteristics by further comprising, after the well area forming step and before the buried diffusion area forming step, forming an auxiliary diffusion area by implanting impurity ions of the second conductivity type beneath the area where the drain area is to be formed so that the bottom of the auxiliary diffusion area reaches a position deeper than the bottom of the buried diffusion area to be formed.

In accordance with the manufacturing method for a semiconductor device according to the fifth characteristics of the present invention, the drain area and the well area under the buried diffusion area can be set to the same electric potential via the impurity diffusion area of the second conductivity type (auxiliary diffusion area) formed in the step of implanting impurity ions of the second conductivity type even in the case where the buried diffusion area is formed so as to divide the well area into upper and lower layers. Therefore, the electrical field is not concentrated in the border portion between the buried diffusion area and the drain area when a reverse bias is applied even in the case where the buried diffusion area is formed so as to divide the well area into upper and lower layers, and therefore, it becomes possible to achieve a high withstand voltage.

In addition to the second characteristics, the manufacturing method for a semiconductor device according to the present invention is characterized as sixth characteristics by further comprising forming drift areas by implanting impurity ions of the second conductivity type having a higher concentration than the impurity ions in the well area forming step so that the drift areas sandwich the body area or the area where the body area is to be formed, after the well area forming step and before the step of forming the source area and the drain area, wherein the drain area is formed by implanting impurity ions of the second conductivity type having a higher concentration than the impurity ions in the drift area forming step into the drift areas.

In addition to any one of the third to fifth characteristics, the manufacturing method for a semiconductor device according to the present invention is characterized as seventh characteristics by further comprising forming a drift area by implanting impurity ions of the second conductivity type having a higher concentration than the impurity ions used in the well area forming step so that the drift area is surrounded by the body area formed in annular form or an area where the body area is to be formed, after the well area forming step and before the step of forming the source area and the drain area, wherein the drain area is formed by implanting impurity ions of the second conductivity type having a higher concentration than the impurity ions in the drift area forming step into the drift area.

In addition to any of the first to seventh characteristics, the manufacturing method for a semiconductor device according to the present invention is characterized as eighth characteristics by further comprising forming a body contact area by implanting impurity ions of the first conductivity type into a predetermined area within the body area after the body area forming step.

In the configuration of the present invention, a semiconductor device having a low on-resistance and a high withstand voltage can be implemented without forming an epitaxial layer.

DESCRIPTION OF THE PREFERRED EMBODIMENTS

A semiconductor device (hereinafter referred to as a "device of the present invention") and its manufacturing method (hereinafter referred to as a "method of the present invention") according to embodiments of the present invention will be described below with reference to the drawings.

First Embodiment

A device of the present invention and a method of the present invention according to a first embodiment (hereinafter occasionally referred to as a "present embodiment") will be described with reference to FIGS. 1 to 8.

Figure 1:
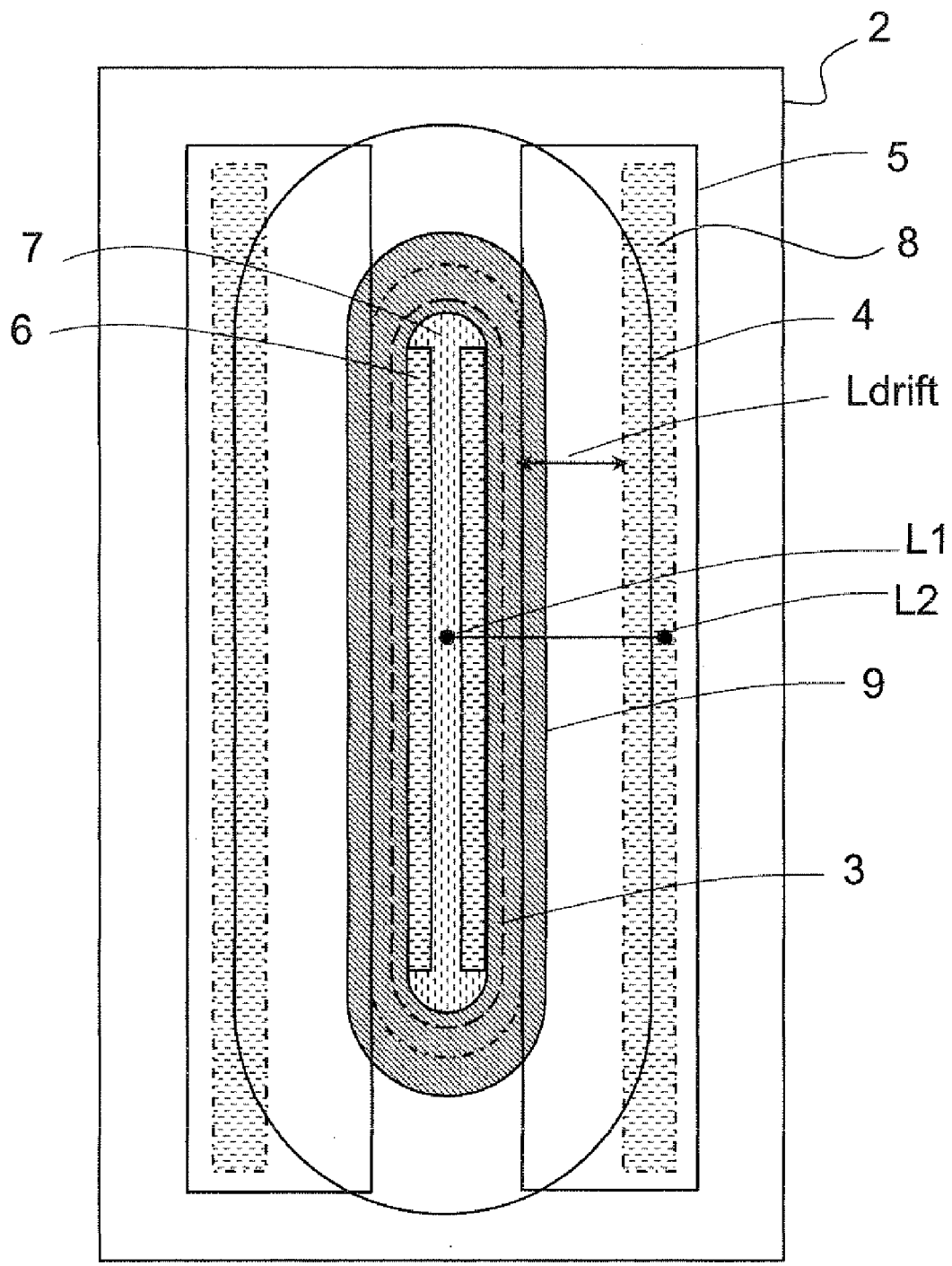
FIG. 1 is a schematic plan diagram showing a semiconductor device according to a first embodiment of the present invention.
Figure 2:
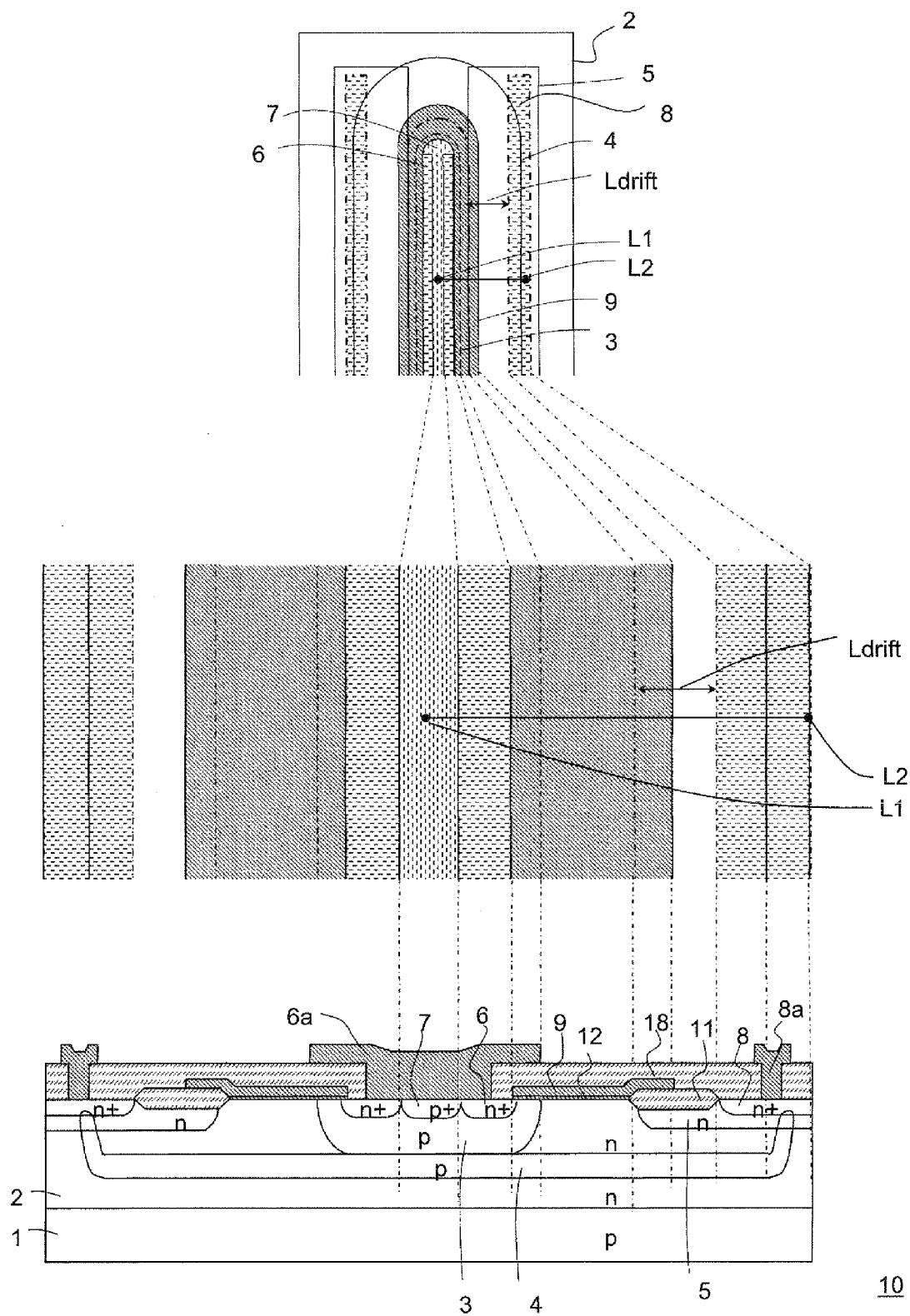
FIG. 2 is a schematic plan diagram and a schematic cross-sectional diagram showing a part of the semiconductor device according to the first embodiment of the present invention.

FIG. 1 is a schematic plan diagram showing the device of the present invention according to the present embodiment. In addition, FIG. 2 is an enlarged diagram and a schematic cross-sectional diagram showing a part of the device of the present invention shown in FIG. 1. Here, the cross-sectional diagram schematically shows the structure, and the dimensions in the figure do not necessarily match the actual dimensions. The same thing is true for following embodiments. In addition, the same components as those in FIGS. 19 to 22 are denoted by the same symbols throughout the drawings.

The device of the present invention 10 shown in FIGS. 1 and 2 is formed of a P-type semiconductor substrate 1, an N-type well area 2, a P-type body area 3, a high concentration P-type buried diffusion area 4, an N-type drift area 5, an N-type source area 6, a P-type body contact area 7, an N-type drain area 8, a gate electrode 9, a gate insulating film 12, a field oxide film 11, a source electrode 6a, a drain electrode 8a and an interlayer insulating film 18.

As shown in the cross-sectional diagram of FIG. 2, the N-type well area 2 is formed on the P-type semiconductor substrate 1, and the P-type body area 3 and the N-type drift area 5 are formed within the N-type well area 2 at a distance from each other. In addition, the P-type buried diffusion area 4 is formed at such a depth as to make contact with the bottom of the body area 3.

The P-type body contact area 7 having a higher concentration than the body area 3 and the high concentration N-type source area 6 are formed within the body area 3. In addition, the source electrode 6a is formed on the body contact area 7 and the source area 6, and the source electrode 6a electrically connects the source area 6 and the body area 3 to the same potential.

The N-type drift areas 5 are formed of an impurity diffusion area having a higher concentration than the N-type well area 2. In addition, the N-type drain areas 8 having a higher concentration than the drift areas 5 are formed within the drift areas 5. In addition, the drain electrodes 8a are formed on these drain areas 8. That is, the body area 3 is formed in the device of the present invention 10 according to the present embodiment so as to be sandwiched by the drain areas 8 formed at a distance from each other.

In addition, the field oxide film 11 is formed on the drift areas 5 so as to isolate the drain areas 8 from the active area. In addition, a gate insulating film 12 is formed so as to cover from the end portion of the source area 6 on the drain area 8 side to the end portion of the field oxide film 11 on the source area 6 side, and the gate electrode 9 is formed on the gate insulating film 12 and a part of the field insulating film 11.

In addition, the interlayer insulating film 18 is formed so as to cover the active area and the source electrode 6a and the drain electrodes 8a are formed so as to penetrate through this interlayer insulating film 18 and are electrically connected to the source area 7 and the drain areas 8.

Here, as shown in FIG. 2, in the device of the present invention 10, the buried diffusion area 4 is formed so as to make contact with the bottom of the body area 3 and extend to an area beneath the drain area 8 in a direction parallel to the substrate. FIG. 2 shows a case where the end portions rise due to the resist formed in tapered form at the time of implantation, as in the device described with reference to FIG. 22B. In the configuration of the device of the present invention, the end portions of the buried diffusion area 4 are formed so as to extend to areas beneath the drain areas 8, and therefore, the buried diffusion area 4 is not formed within the drift areas 5 positioned between the source area 7 and the drain areas 8, even in the case where the end portions rise due to the resist formed in tapered form at the time of ion implantation.

Figure 3:
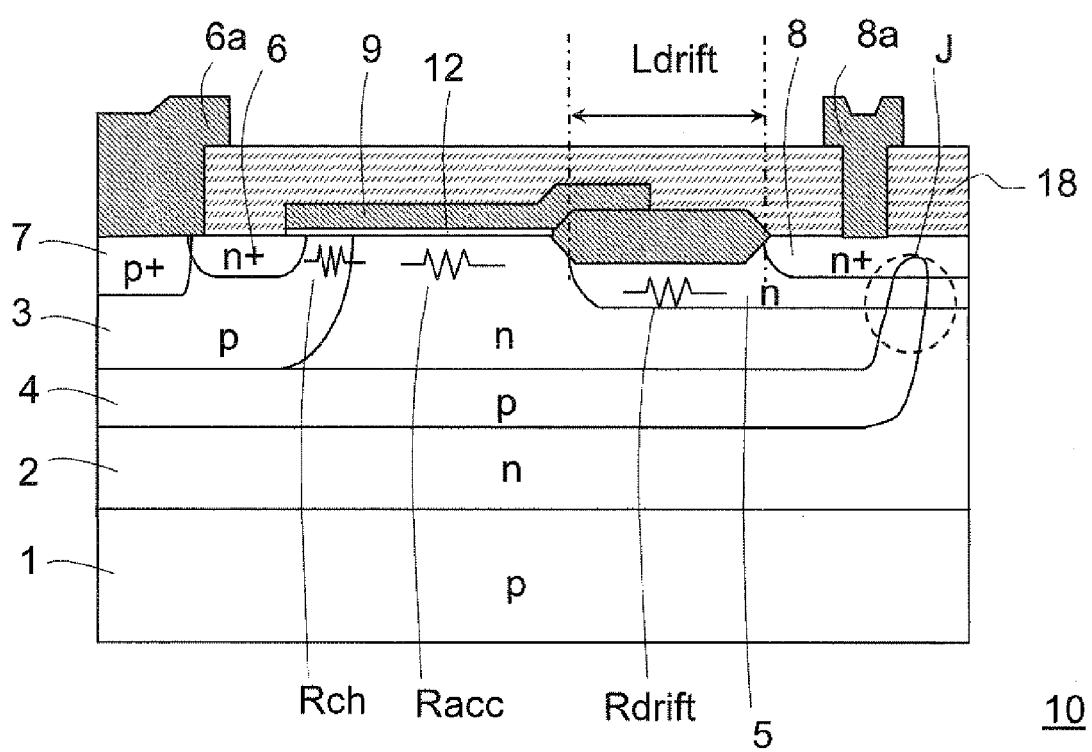
FIG. 3 is a schematic cross-sectional diagram showing a part of the semiconductor device according to the first embodiment of the present invention.
Figure 4:
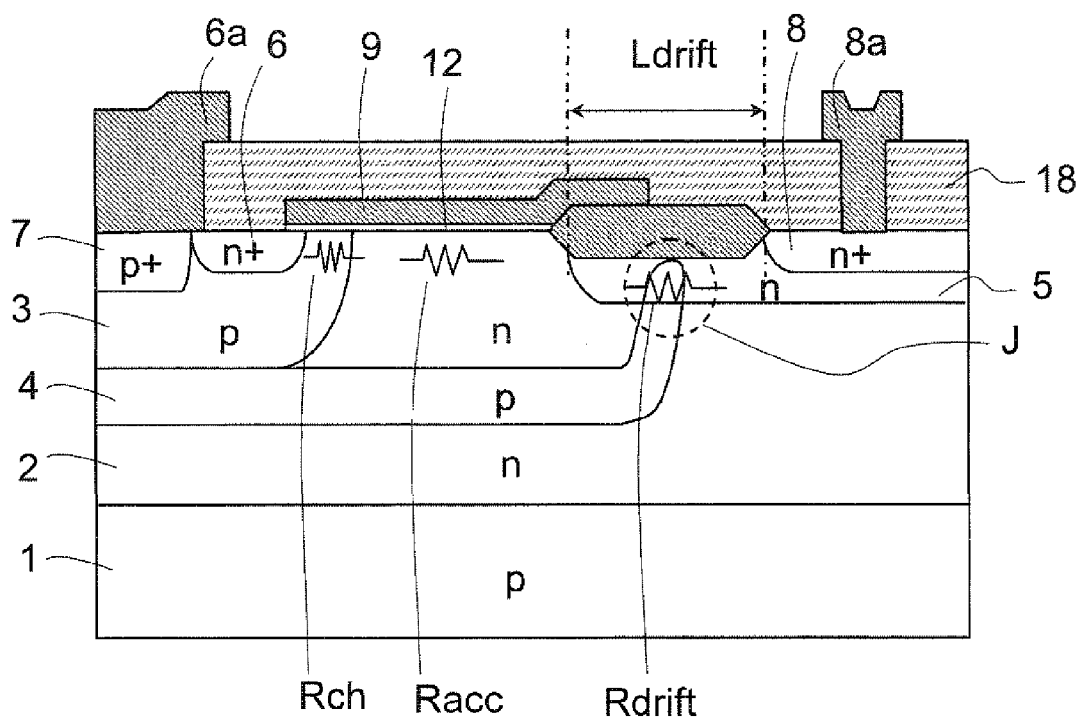
FIG. 4 is a schematic cross-sectional diagram for illustrating the on-resistance of an LDMOS transistor manufactured in accordance with a conventional method.

FIG. 3 is a schematic cross-sectional diagram showing the structure of the device of the present invention 10 taken along line L1-L2 of FIG. 2. Here, an on-resistance Ron between the source area 6 and the drain area 8 in the on state in the case where the device of the present invention 10 is used as a switching element can be represented by the following (Equation 1) when a channel resistance of the MOSFET where electrons are introduced is Rch, a resistance within the area where electrons accumulate in the area where the gate and the drain overlap is Racc and a resistance within the drift area 5 which is thinly doped is Rdrift.

$$Ron=Rch+Racc+Rdrift \quad (1)$$

As described in the above Related Art, when P-type impurity ions are implanted with high energy in order to form the buried diffusion area 4, the end portions of the buried diffusion area 4 rise upward, as described above, in the case where the taper angle of the resist is not 90 degrees. At this time, in the case where the buried diffusion area 4 does not extend to the area beneath the drain areas 8 in a lateral direction like in the conventional LDMOS transistor 100, the rising end portions J of the buried diffusion area 4 reach inside the drift areas 5 positioned between the drain areas 8 and the source area 6 (see FIG. 4). The buried diffusion area 4 is formed of a high concentration P-type impurity diffusion area, while the drift area 5 is formed of an N-type impurity diffusion area, and as a result, the resistance value of the drift resistance Rdrift increases and the on-resistance Ron increases.

Like in the device of the present invention 10, however, in the case where the buried diffusion area 4 extends to the areas beneath the drain areas 8 in the lateral direction, the rising end portions J of the buried diffusion area 4 are positioned closer to the drain areas 8 side than the end portions of the drain areas 8 on the source area 6 side even in the case where the taper angle of the resist is not 90 degrees. In other words, the buried diffusion area 4 is not formed within the drift area 5 positioned between the drain areas 8 and the source area 6. Therefore, the drift resistance Rdrift does not increase, and as a result, the on-resistance Ron does not increase, and thus, a lower on-resistance than in the case of FIG. 4 can be achieved.

Figure 5:
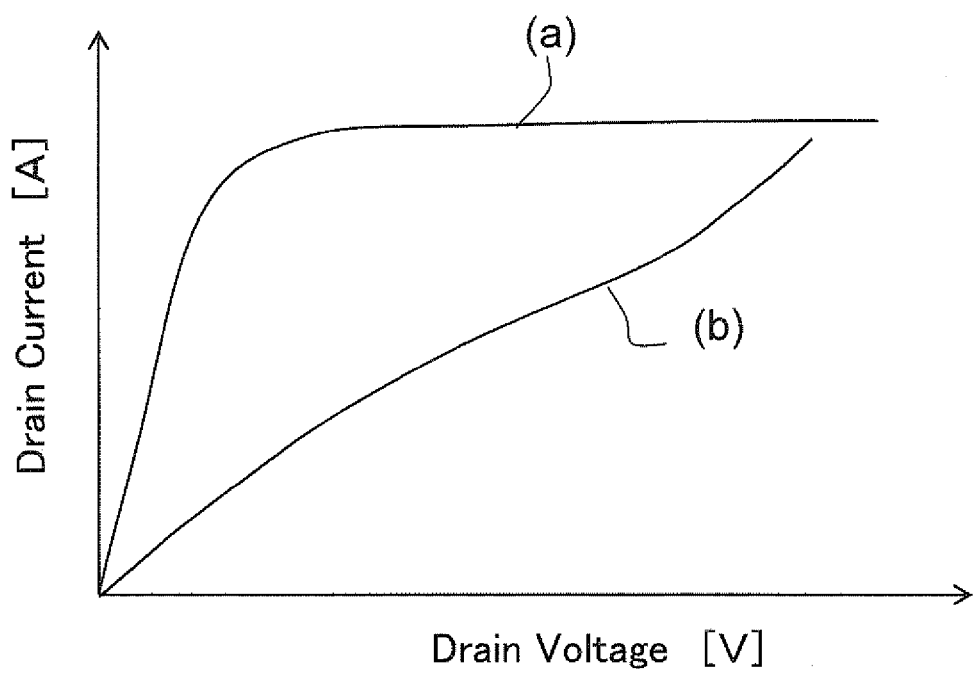
FIG. 5 is a graph comparing electrical properties between the semiconductor device according to the present invention and an LDMOS transistor manufactured in accordance with a conventional method.

FIG. 5 shows the voltage-current properties in a state where the source electrode 6a is set to GND potential and a positive voltage is applied to the gate electrode 9 and the drain electrode 8a (when the gate is on) in the case (a) where the P-type buried diffusion area 4 extends beneath the N-type drain area 8 and in the case (b) where it does not.

It can be seen from the curve (b) in FIG. 5 that the drain current is restricted when Rdrift increases, particularly in the voltage area where the drain voltage is low, in the case where the buried diffusion area 4 does not extend beneath the drain area 8 like in the conventional method. Meanwhile, it can be seen that in the curve (a) the on-properties are normal because the Rdrift does not increase in the case where the buried diffusion area 4 extends beneath the drain area 8 like in the device of the present invention 10.

Figure 6:
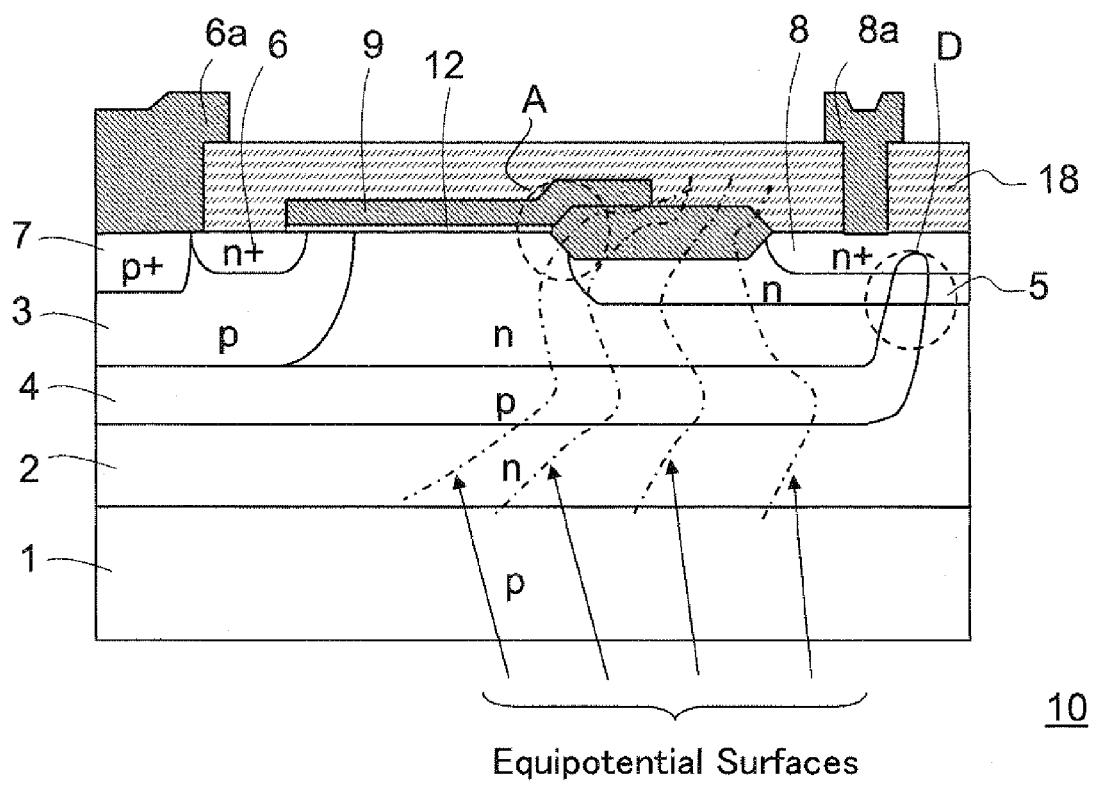
FIG. 6 is a diagram showing a state of equipotential lines in the case where a reverse bias is applied to the semiconductor device according to the first embodiment of the present invention.

FIG. 6 shows a part of equipotential lines in the case where the source electrode 6a and the gate electrode 9 are set to the GND potential and a positive voltage is applied to the drain electrodes 8a in the device of the present invention 10. Like in the conventional configuration shown in FIG. 19, the buried diffusion area 4 makes a depletion layer extend toward the drift area 5 when a reverse bias is applied, and thus, the electrical field in the vicinity of the surface (area A), including the edges of the gate, can be sufficiently mitigated. Therefore, a higher withstand voltage can be achieved in the case where the concentration of the drain areas 8 remains the same. In contrast, in the case where the same withstand voltage is secured, the concentration of the drain areas 8 can be set higher, and thus, the on-resistance can be further lowered.

As described above, when impurity ions are implanted in order to form the buried diffusion area 4, ions are implanted under such conditions that the buried diffusion area 4 extends beneath the drain areas 8, and thus, the buried diffusion area 4 extends to these areas, so that stable reduction in the on-resistance and increase in the withstand voltage can be achieved during a manufacturing process, irrespectively of the taper angle of the resist when impurity ions are implanted.

A manufacturing process for the device of the present invention 10 according to the present embodiment will be described below. FIG. 7 is a schematic cross-sectional diagram showing the structure at each step in a manufacture of the device of the present invention 10 in accordance with the method of the present invention, and FIGS. 7A to 7E show the steps in order. In addition, FIG. 8 is a flow chart showing the steps in the manufacture in the method of the present invention according to the present embodiment, and the steps in the following description represent the steps in the flow chart shown in FIG. 8.

Figure 7A:
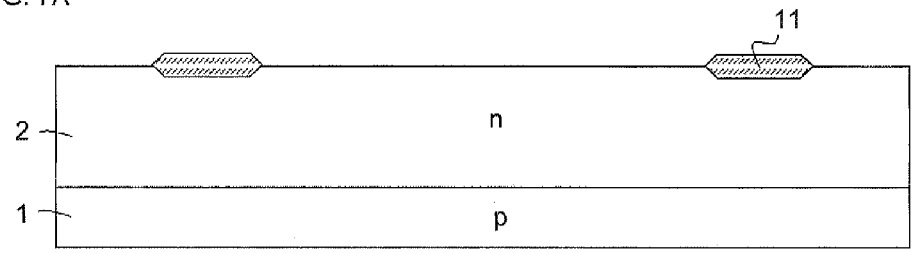
FIGS. 7A to 7E are schematic cross-sectional diagrams showing the structure at each step in a manufacture of the semiconductor device according to the first embodiment of the present invention.
Figure 8:
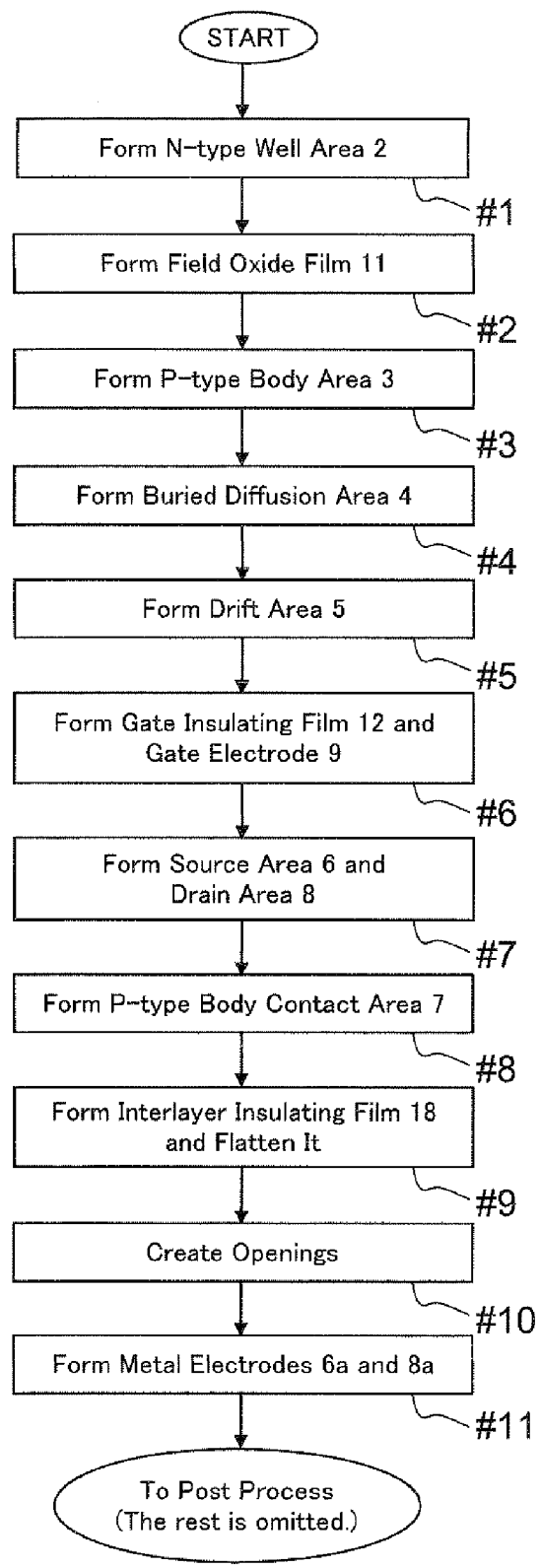
FIG. 8 is a flow chart illustrating the steps in the manufacture in order when the semiconductor device according to the first embodiment of the present invention is manufactured.

First, as shown in FIG. 7A, N-type impurity ions are implanted in a P-type semiconductor substrate 1, and after that, an N-type well area 2 is formed through thermal diffusion by means of high temperature drive-in (Step #1), and then, a field oxide film 11 is formed in accordance with a publicly known LOCOS (LOCal Oxidation of Silicon) method (Step #2). As for the conditions for ion implantation in Step #1, phosphorous ions are implanted with an implantation energy of 2 MeV or higher, for example, and a dose of $1.0 \times 10^{13}/cm^2$ or less. In addition, the area in which impurities are implanted is defined using a thick resist for implantation with high energy, which is patterned so that areas for implantation are open in accordance with a photo etching technology, for example.

Figure 7B:
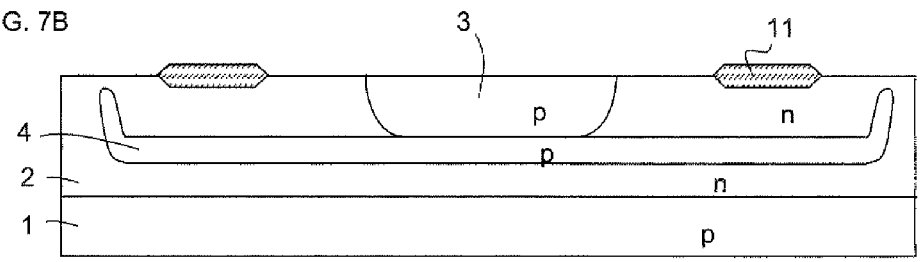

Next, as shown in FIG. 7B, P-type impurity ions (for example boron ions) are implanted so that a P-type body area 3 is formed (Step #3). After that, the area for the P-type buried diffusion area 4 is defined by the resist mask, so that the area can extend beneath the area where the drain area 8 is to be formed in the later step, and P-type impurity ions are implanted with high energy, thereby forming a P-type buried diffusion area 4 (Step #4). As for the conditions for ion implantation in Step #4, boron ions are implanted with an implantation energy of 1 MeV or higher and a dose of $1.0 \times 10^{12}/cm^2$ or more.

Figure 7C:
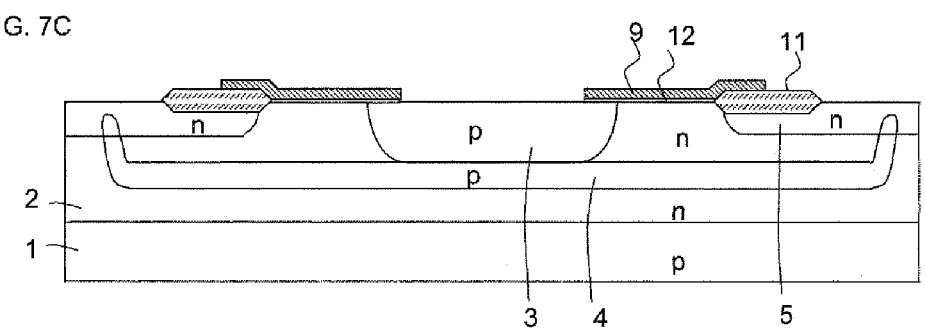

Next, as shown in FIG. 7C, N-type impurity ions are implanted in a position at a distance from the body area 3 thereby forming drift areas 5 (Step #5). As for the conditions for ion implantation in Step #5, phosphorous ions are implanted with an implantation energy of 300 keV or higher and a dose of $5.0 \times 10^{11}/cm^2$ to $5.0 \times 10^{12}/cm^2$ or more. The drift areas 5 are formed in order to reduce the on-resistance without lowering the withstand voltage of the LDMOS transistor. When Step #5 is carried out, the drift areas 5 are formed so as to sandwich the body area 3.

After that, a gate insulating film 12 is formed on the surface of the well area 2, and furthermore, a gate electrode 9 is formed so as to cover from the end portion of the body area 3 on the drift area 5 side to a part of the field oxide film 11 (Step #6). In the method for forming the gate electrode 9, a polysilicon film doped with phosphorous is formed in accordance with a CVD method, and a resist is formed on top of polysilicon film and patterned in accordance with a photo etching technology, and after that, the polysilicon film is processed in accordance with a dry etching technology or the like, thereby forming a gate electrode 9.

Figure 7D:
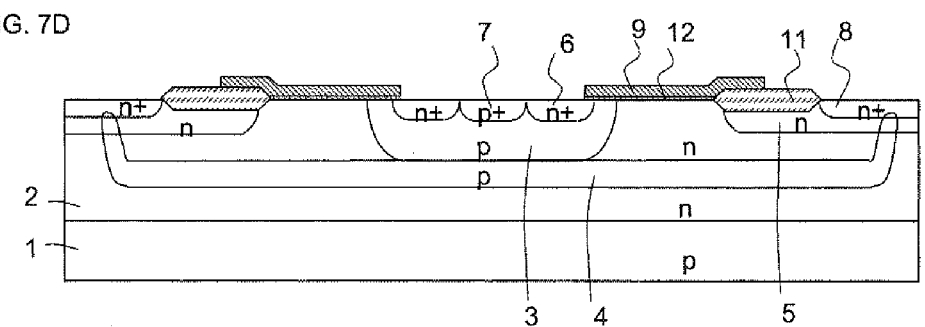

Next, as shown in FIG. 7D, high concentration N-type impurity ions (for example phosphorous ions or arsenic ions) are implanted in the body area 3 and the drift area 5 so that a source area 6 and drain areas 8 are formed within the body area 3 and the drift areas 5, respectively (Step #7). Furthermore, high concentration P-type impurity ions (for example boron ions) are implanted in the body area 3 thereby forming a P-type body contact area 7 (Step #8). When Step #7 is carried out, drain areas 8 are formed so as to sandwich the source area 6.

Figure 7E:
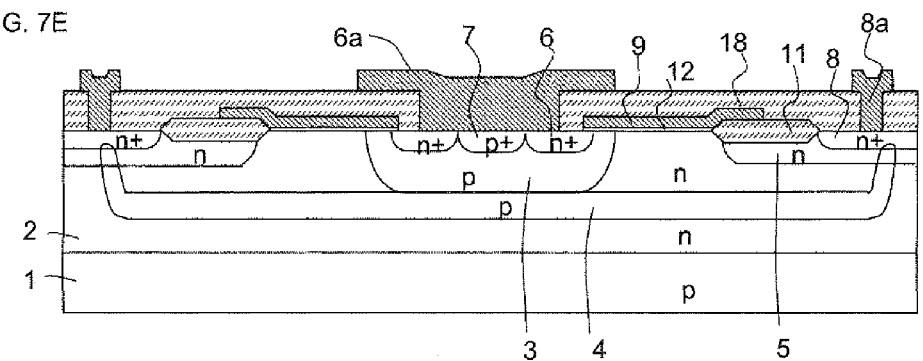

Next, as shown in FIG. 7E, an interlayer insulating film 18 is formed on the surface in accordance with a normal pressure CVD (Chemical Vapor Deposition) method, for examples and after that, a flattening process is carried out, so that the difference in level of the surface become smaller (Step #9). After that, contact etching is carried out on the interlayer insulating film 18 above the gate electrode 9, the drain areas 8, the source area 6 and the body contact area 7, thereby creating respective openings (Step #10). After that, a conductive material film (for example an Al film) is grown in accordance with a sputtering method, for example, and after that, the film is patterned through photo etching and dry etching, thereby forming metal electrodes (6a and 8a) (Step #11). The device of the present invention 10 can be implemented through the above described steps.

As described above, the P-type buried diffusion area 4 is formed so as to extend to the N-type drain areas 8, and thus, a semiconductor device can be manufactured in which stable reduction in the on-resistance and increase in the withstand voltage can be achieved during the manufacturing process, irrespectively of the taper angle of the resist when impurity ions are implanted with high energy in Step #4.

Second Embodiment

A device of the present invention and a method of the present invention according to a second embodiment (hereinafter referred to as a "present embodiment") will be described with reference to FIGS. 9 to 12.

Figure 9:
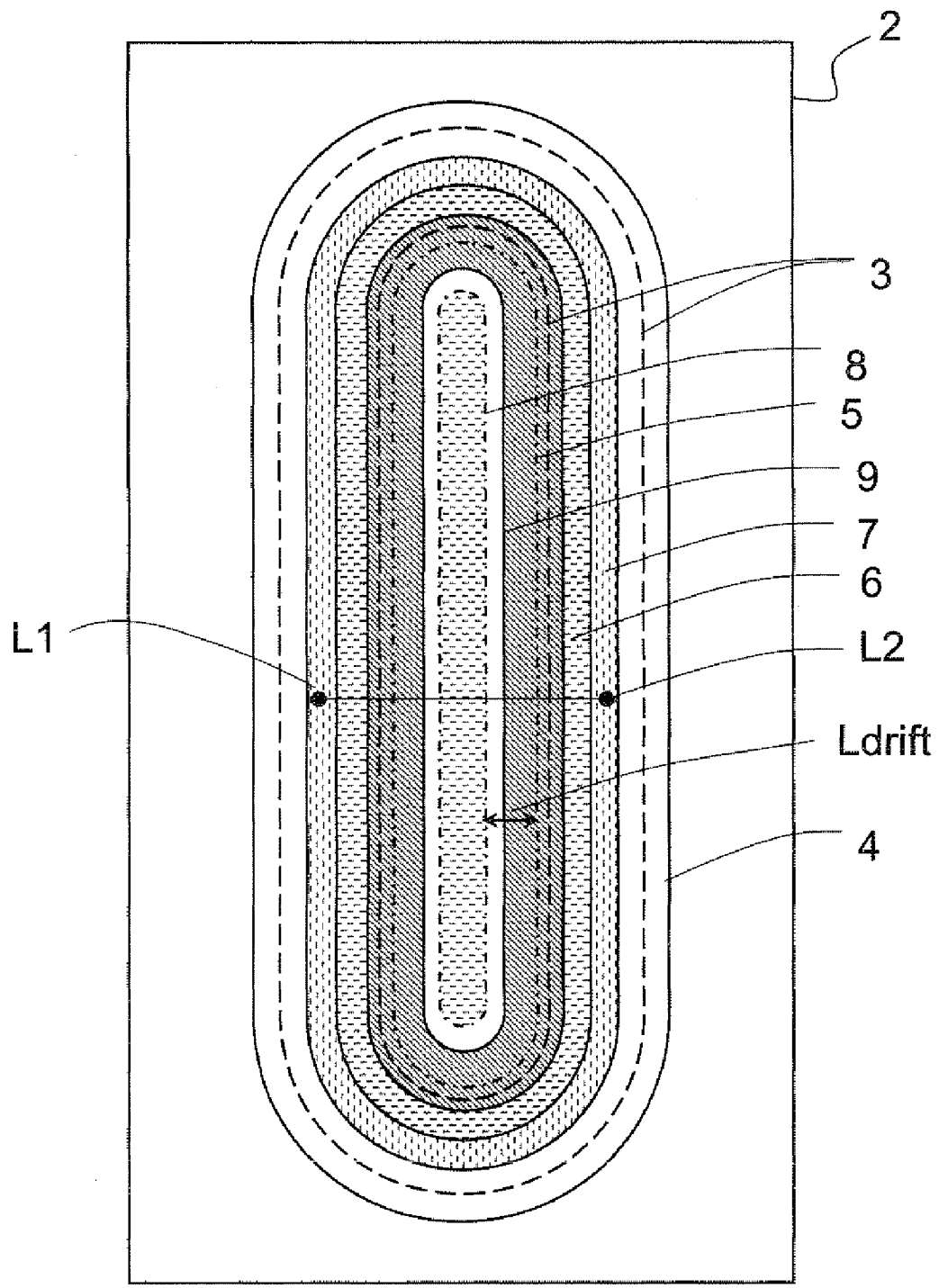
FIG. 9 is a schematic plan diagram showing a semiconductor device according to a second embodiment of the present invention.
Figure 10:
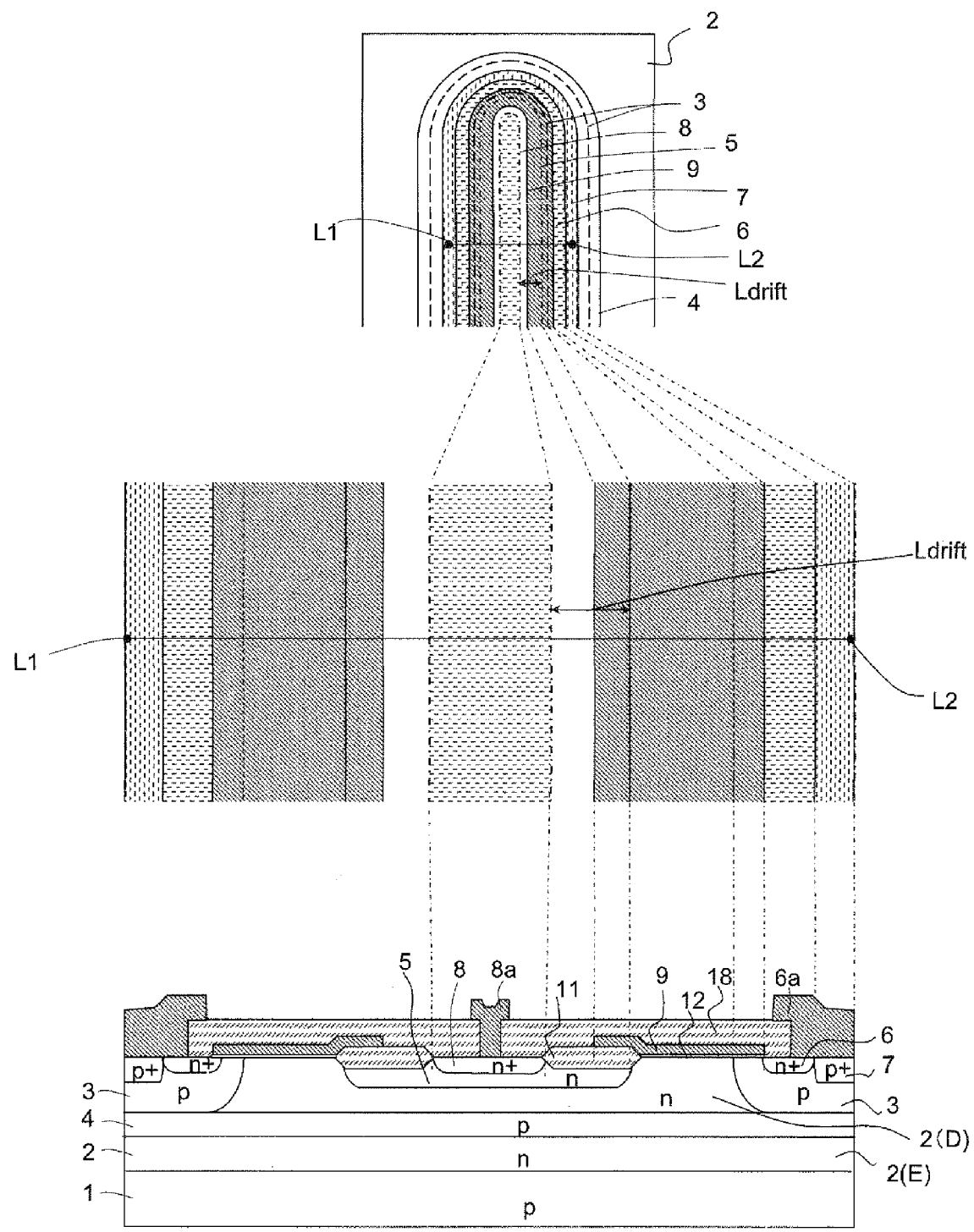
FIG. 10 is a schematic plan diagram and a schematic cross-sectional diagram showing a part of the semiconductor device according to the second embodiment of the present invention.

FIG. 9 is a schematic plan diagram showing the device of the present invention according to the present embodiment. In addition, FIG. 10 is an enlarged diagram and a schematic cross-sectional diagram showing a part of the device of the present invention shown in FIG. 9. Here, the same components as those in the first embodiment are denoted by the same symbols, and the description thereof will not be given here.

As shown in FIGS. 9 and 10, the device of the present invention 10a according to the present embodiment is different from the first embodiment in that the body area 3 is formed so as to surround the drain area 8. The rest of the configuration is similar to that of the first embodiment.

The present embodiment has a configuration where the drain area 8 is formed in the center portion and the body area 3 is formed in the outer peripheral portion thereof In addition, like in the first embodiment, the P-type buried diffusion area 4 is formed so as to make contact with the bottom of the body area 3 and extend to an area beneath the drain area 8. In the present embodiment, the buried diffusion area 4 is formed so as to completely cover the area beneath the drain area 8 formed in the center portion.

Figure 11:
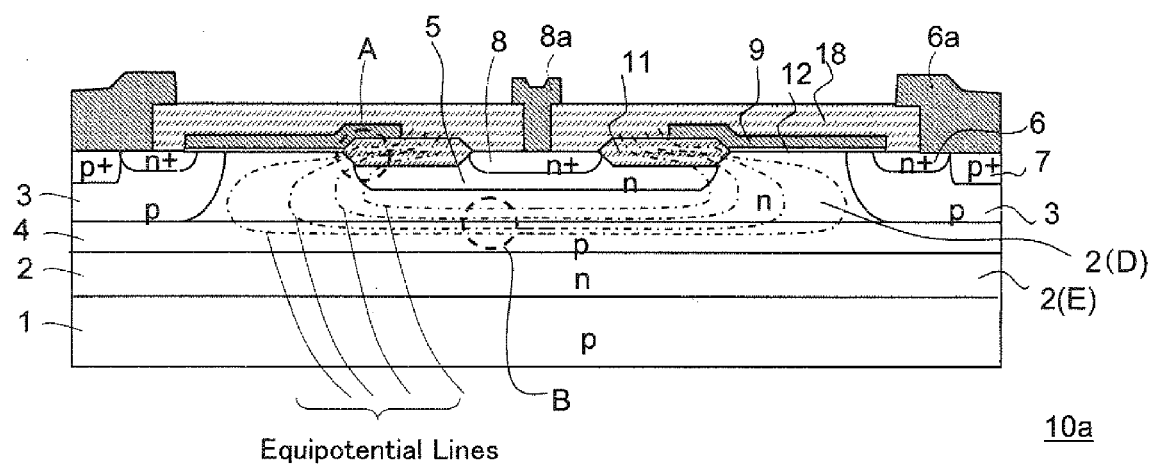
FIG. 11 is a diagram showing a state of equipotential lines in the case where a reverse bias is applied to the semiconductor device according to the second embodiment of the present invention.

FIG. 11 shows a part of equipotential lines in the case where the source electrode 6a and the gate electrode 9 are set at the GND potential and a positive voltage is applied to the drain electrode 8a in the device of the present invention 10a. Like in the device of the present invention 10 according to the first embodiment, the buried diffusion area 4 can make the depletion layer extend toward the drift area 5 when a reverse bias is applied, so that the electrical field in the vicinity of the surface (area A) including the edges of the gate can be sufficiently mitigated. Therefore, in the case where the concentration of the drain area 8 remains the same, a higher withstand voltage can be achieved. In contrast, in the case where the same withstand voltage is secured, the concentration of the drain area 8 can be set higher, so that the on-resistance can further be lowered.

That is, in the present embodiment, when impurity ions are implanted in order to form the buried diffusion area 4, ions are implanted under such conditions that the buried diffusion area 4 extends beneath the drain area 8 so that the buried diffusion area 4 extends to this area, and thus, stable reduction in the on-resistance and increase in the withstand voltage can be achieved during the manufacturing process, irrespectively of the taper angle of the resist when impurity ions are implanted.

A manufacturing process for the device of the present invention 10a according to the present embodiment will be described below. FIGS. 12A to 12E are schematic cross-sectional diagrams showing the structure in each step in a manufacture of the device of the present invention 10a in accordance with the method of the present invention, and FIGS. 12A to 12E show the steps in order.

The method of the present invention according to the present embodiment is the same as the method of the present invention according to the first embodiment, except that the areas in which ions are implanted are different. Hereinafter, the same steps as the process steps according to the first embodiment are denoted by the same symbols, and the description thereof is simplified.

Figure 12A:
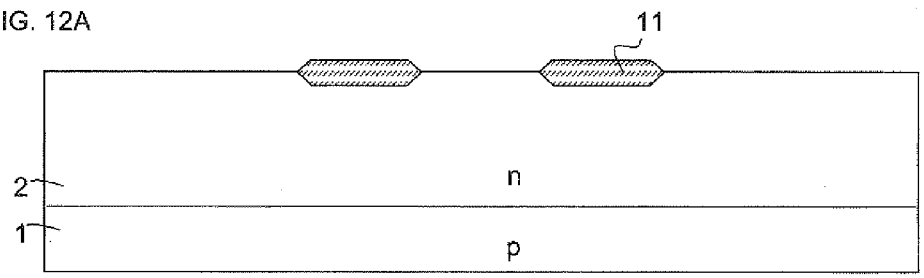
FIGS. 12A to 12E are schematic cross-sectional diagrams showing the structure at each step in a manufacture of the semiconductor device according to the second embodiment of the present invention.

First, as shown in FIG. 12A, N-type impurity ions are implanted in a P-type semiconductor substrate 1, and after that, an N-type well area 2 is formed through thermal diffusion by means of high temperature drive-in (Step #1), and then, a field oxide film 11 is formed in accordance with a publicly known LOCOS method (Step #2).

Figure 12B:
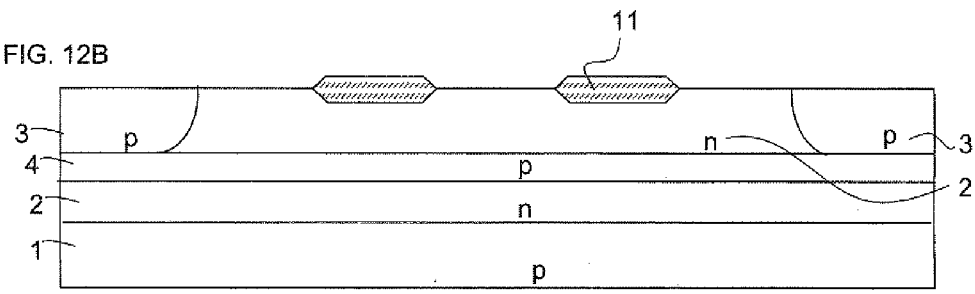

Next, as shown in FIG. 12B, a P-type body area 3 is formed by implanting P-type impurity ions (for example boron ions) (Step #3). At this time, ions are implanted by defining the area for the body area 3 using a resist mask so that the body area 3 is formed in annular form. After that, the area for a P-type buried diffusion area 4 is defined by the resist mask so that the area can extend beneath an area where the drain area 8 is to be formed in a later step, and P-type impurity ions are implanted with high energy, thereby forming the P-type buried diffusion area 4 (Step #4). At this time, the buried diffusion area 4 is formed so as to extend from the bottom of the body area 3 formed in annular form to the area surrounded by the body area 3. Here, in the present embodiment, ions are implanted by defining the area for the buried diffusion area 4 using a resist mask so that the buried diffusion area 4 completely occupies the inside of the area surrounded by the body area 3.

Figure 12C:
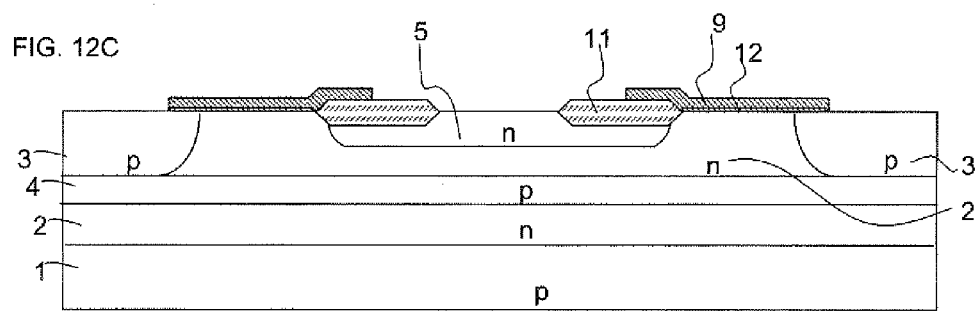

Next, as shown in FIG. 12C, N-type impurity ions are implanted in a position at a distance from the body area 3, and thus, a drift area 5 is formed (Step #5). Concretely, N-type impurity ions are implanted in a part of the area inside surrounded by the body area 3 formed in annular form. When Step #5 is carried out, the drift area 5 is formed so as to be surrounded by the body area 3.

After that, a gate insulating film 12 is formed on the surface of the well area 2, and furthermore, a gate electrode 9 is formed so as to cover from the end portion of the body area 3 on the drift area 5 side to a part of the field oxide film 11 (Step #6).

Figure 12D:
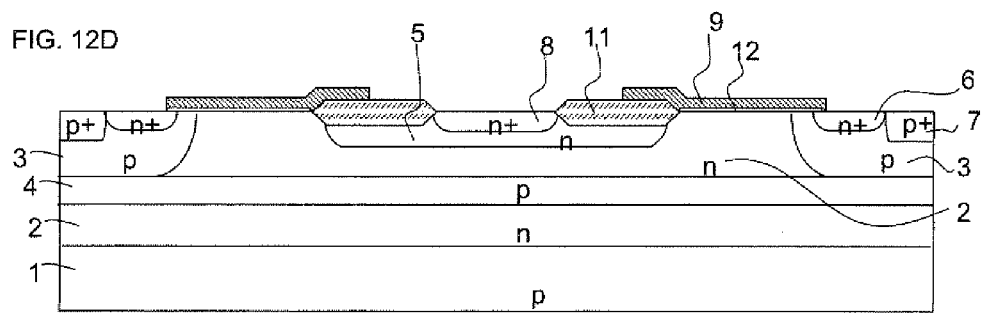

Next, as shown in FIG. 12D, high concentration N-type impurity ions (for example phosphorous ions or arsenic ions) are implanted to the body area 3 and the drift area 5 so that a source area 6 and a drain area 8 are formed within the body area 3 and the drift area 5, respectively (Step #7). Furthermore, high concentration P-type impurity ions (for example boron ions) are implanted in the body area 3 thereby forming a P-type body contact area 7 (Step #8). When Step #7 is carried out, the drain area 8 is formed so as to be surrounded by the source area 7 formed in annular form.

Figure 12E:
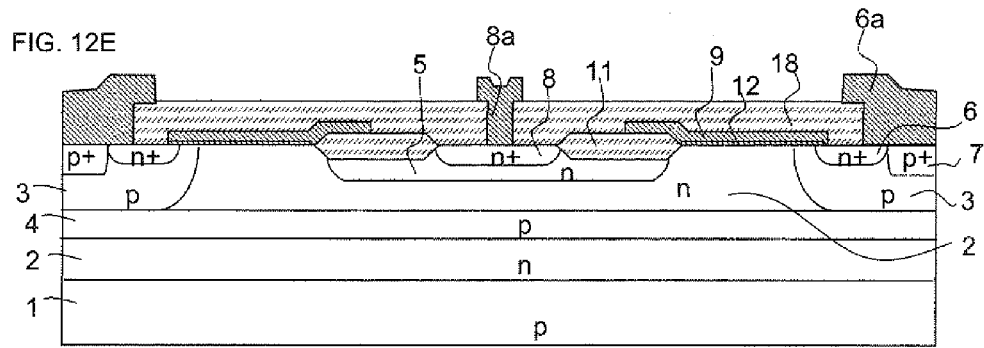

Next, as shown in FIG. 12E, an interlayer insulating film 18 is formed on the surface in accordance with a normal pressure CVD method, for example, and after that, a flattening process is carried out, so that the difference in level of the surface become smaller (Step #9). After that, contact etching is carried out on the interlayer insulating film 18 above the gate electrode 9, the drain area 8, the source area 6 and the body contact area 7 thereby creating respective openings (Step #10). After that, a conductive material film (for example an Al film) is grown in accordance with a sputtering method, for example, and then, the film is patterned through photo etching and dry etching thereby forming metal electrodes (6a and 8a) (Step #11). The device of the present invention 10 is gained through the above described steps.

As described above, the buried diffusion area 4 is formed so as to extend from the bottom of the body area 3 formed in annular form to a portion beneath the drain area 8 formed in an area surrounded by the body area 3 in annular form, and thus, a semiconductor device can be manufactured in which stable reduction in the on-resistance and increase in the withstand voltage can be achieved during the manufacturing process, irrespectively of the taper angle of the resist when impurity ions are implanted with high energy in Step #4.

Third Embodiment

A device of the present invention and a method of the present invention according to a third embodiment (hereinafter referred to as a "present embodiment") will be described with reference to FIGS. 13 and 14.

Figure 13:
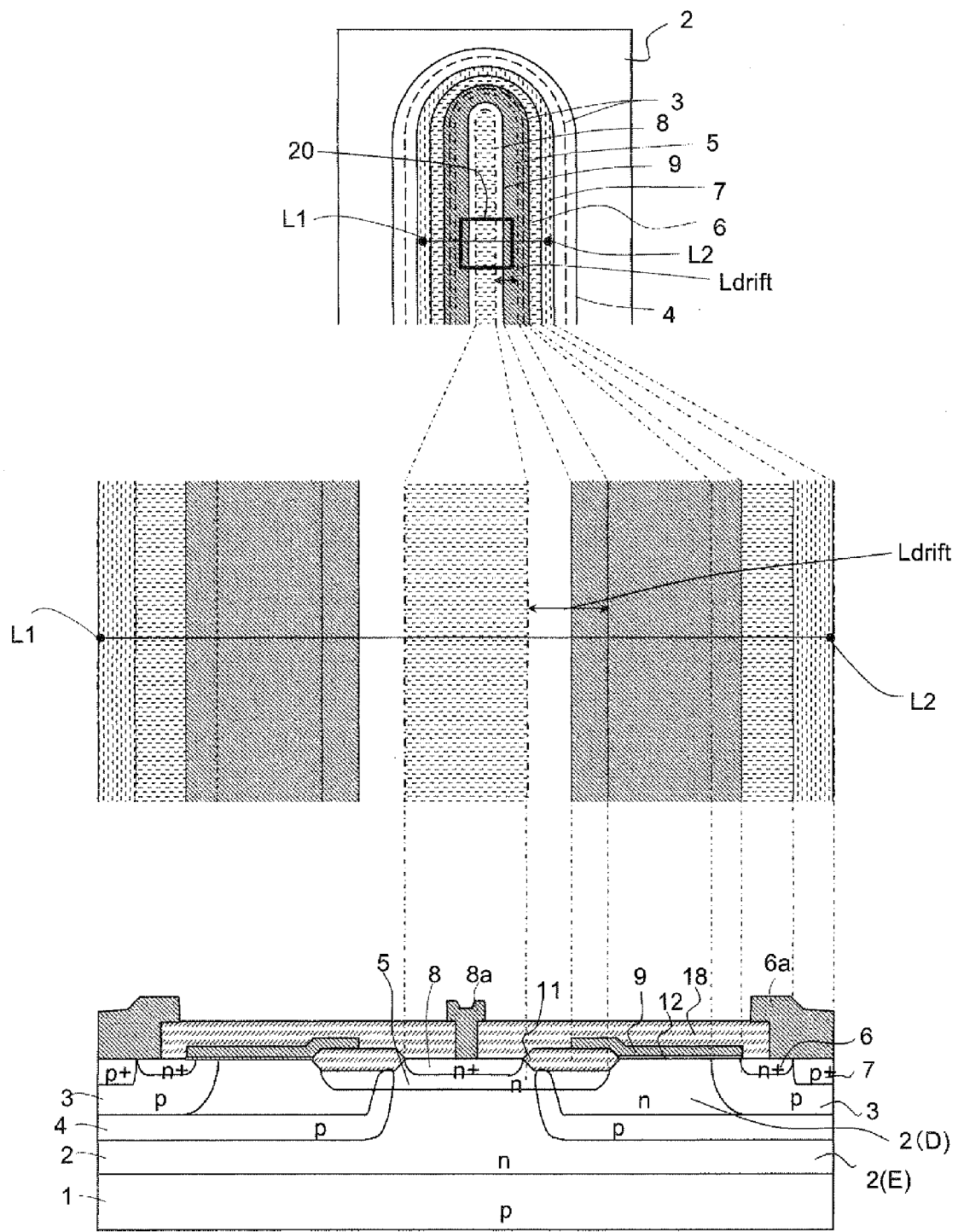
FIG. 13 is a schematic plan diagram and a schematic cross-sectional diagram showing a semiconductor device according to a third embodiment of the present invention.

FIG. 13 is a schematic plan diagram and a schematic cross sectional diagram showing the device of the present invention according to the present embodiment. Here, the same components as those in the first and second embodiments are denoted by the same symbols, and the description thereof will not be given here.

As shown in FIG. 13, the device of the present invention 10b according to the present embodiment is formed in such a manner that the body area 3 surrounds the drain area 87 as with the device of the present invention 10a according to the second embodiment. In addition, like in the second embodiment, the P-type buried diffusion area 4 is formed so as to make contact with the bottom of the body area 3 and extend to an area beneath the drain area 8. In addition, unlike in the second embodiment, there is an area where the buried diffusion area 4 is not formed beneath a part 20 of the drain area 8 (hereinafter referred to as a "potential setting area 20").

When the buried diffusion area 4 extends so as to completely cover the bottom of the drain area 8, as in the device of the present invention 10a according to the second embodiment (see FIG. 10), the well area 2 (area E) under the buried diffusion area 4 is electrically isolated from the well area 2 (area D) over the buried diffusion area 4, and therefore, the area E becomes of a floating potential.

Therefore, as shown in FIG. 11, when the source electrode 6a and the gate electrode 9 are set at the GND potential and a positive voltage is applied to the drain electrode 8a in the device of the present invention 10a according to the second embodiment, the potential of the area E is fixed at the GND potential, which is approximately the same as that of the semiconductor substrate 1, and therefore, all the equipotential lines are distributed between the buried diffusion area 4 and the drain area 8. Accordingly, although the concentration of the electrical field can be mitigated at the edges of the gate (area A), the electrical field is concentrated in the border portion (area B) between the buried diffusion area 4 and the drain area 8.

Accordingly, in some cases the withstand voltage as determined by the area B is lower than the withstand voltage as determined by the area A, depending on the profile of the concentration of the drift area 5, and therefore, the withstand voltage lowers.

In the device of the present invention 10b according to the present embodiment, measures are taken against this. That is, the present embodiment is characterized in that an area where the buried diffusion area 4 is not formed is provided beneath the potential setting area 20, which is a part of the drain area 8, and thus, the potential of the well area 2 (area E) under the buried diffusion area 4 can be set to the same potential as the drain area 8.

Figure 14:
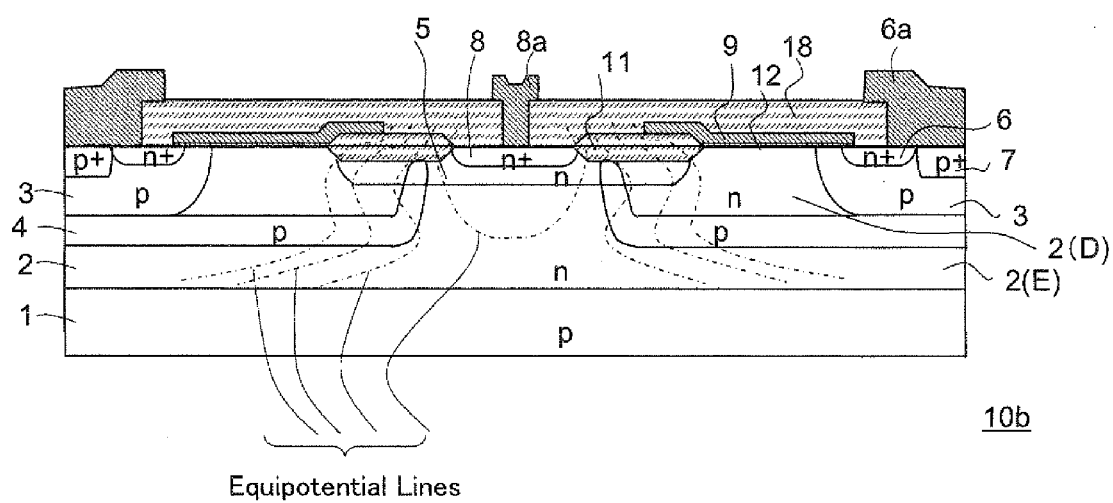
FIG. 14 is a diagram showing a state of equipotential lines in the case where a reverse bias is applied to the semiconductor device according to the third embodiment of the present invention.

FIG. 14 shows a part of the equipotential lines in the case where the source electrode 6a and the gate electrode 9 are set at the GND and a positive voltage is applied to the drain electrode 8a in the device of the present invention 10b according to the present embodiment. As shown in FIG. 14, the potential of the area E is the same as the potential of the drain electrode 8a, and therefore, the electrical field is not concentrated in the border portion between the buried diffusion area 4 and the drain area 8 unlike the distribution in the potential in the device of the present invention 10a according to the second embodiment shown in FIG. 11. Therefore, the withstand voltage of the device as a whole is not determined by the conditions for the withstand voltage in the border portion between the buried diffusion area 4 and the drain area 8, and thus, a semiconductor device having a higher withstand voltage than the second embodiment can be implemented.

Here, in the present embodiment, the buried diffusion area 4 is not formed in a part of the area beneath the drain area 8 unlike in the second embodiment. Accordingly, it may be assumed that the end portion of the buried diffusion area 4 extends into the drift area 5, depending on the taper angle of the resist when ions are implanted in order to form the buried diffusion area 4. In such cases, the drift resistance Rdrift locally increases within this area. However, an area where the buried diffusion area 4 is not formed is provided beneath the drain area 8, so that the well areas 2 formed over and under the buried diffusion area 4 in such a manner as to sandwich the buried diffusion area 4 are electrically connected to the same potential. That is, the area where the buried diffusion area 4 is not formed may be locally formed within a part of the area beneath the drain area 8, or in other words, the buried diffusion area 4 may be formed in most of the area beneath the drain area 8, as in the second embodiment.

In this case, the drift resistance Rdrift increases only in a small part of the area, and the on-resistance Ron as a whole can be greatly lowered in comparison with in the conventional configuration, as in the first and second embodiments. Accordingly, in the present embodiment, stable reduction in the on-resistance and increase in the withstand voltage can be achieved during the manufacturing process, irrespectively of the taper angle of the resist when impurity ions are implanted.

Here, the method of the present invention according to the present embodiment is the same as the method of the present invention according to the second embodiment, except that the areas for the resist mask are different when ions are implanted in Step #4, and therefore, the description thereof will not be given here. In the present embodiment, P-type impurity ions are implanted with high energy in such a state that the resist mask is formed so that a non-implantation area is provided in a part of the area beneath the area where the drain area 8 is to be formed in Step #4, and thus, the P-type buried diffusion area 4 is formed. As a result, in the later steps in the manufacture, an area where the buried diffusion area 4 is not formed is formed in a part of the area beneath the drain area 8 in the device of the present invention 10b. Therefore, the well areas 2 formed over and under the buried diffusion area 4 so as to sandwich the buried diffusion area 4 are electrically connected to the same potential, thus preventing the well area 2 under the buried diffusion area 4 from becoming of a floating state, and thus, the electrical field can be prevented from becoming concentrated in the border portion between the buried diffusion area 4 and the drain area 8.

In addition, like in the second embodiment, the buried diffusion area 4 is formed so as to extend from the bottom of the body area 3 formed in annular form to a portion beneath the drain area 8 formed in an area surrounded by the body area 3 in annular form, and therefore, a semiconductor device where stable reduction in the on-resistance and increase in the withstand voltage can be achieved during the manufacturing process, irrespectively of the taper angle of the resist when impurity ions are implanted with high energy in Step #4, can be manufactured.

Fourth Embodiment

A device of the present invention and a method of the present invention according to a fourth embodiment (hereinafter referred to as a "present embodiment") will be described with reference to FIGS. 15 to 18.

Figure 15:
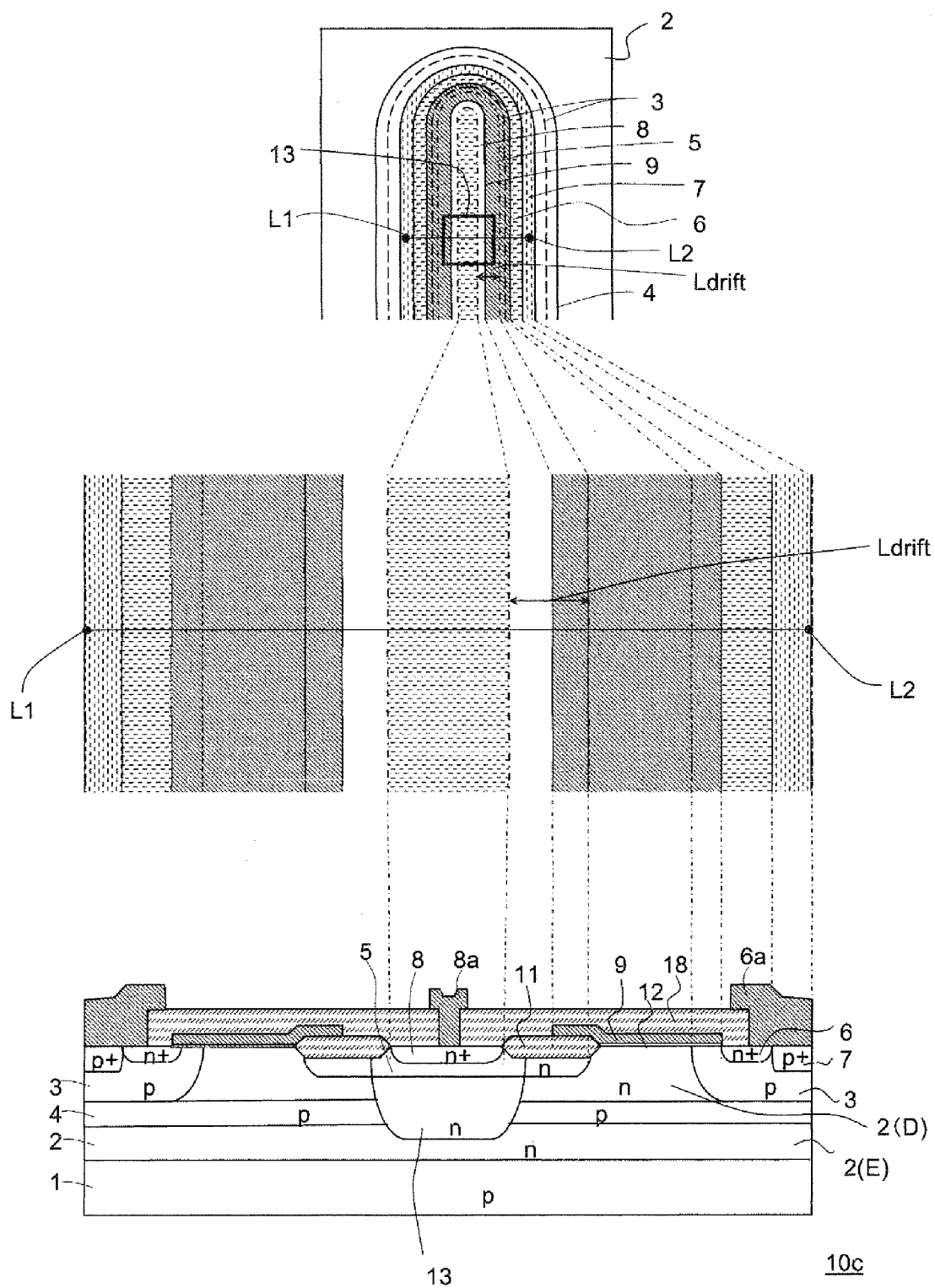
FIG. 15 is a schematic plan diagram and a schematic cross-sectional diagram showing a semiconductor device according to a fourth embodiment of the present invention.

FIG. 15 is a schematic plan diagram and a schematic cross-sectional diagram showing the device of the present invention according to the present embodiment. Here, the same components as those in the first to third embodiments are denoted by the same symbols, and the description thereof will not be given here.

As shown in FIG. 15, the device of the present invention 10c according to the present embodiment is formed so that the body area 3 surrounds the drain area 8, as in the device of the present invention 10a according to the second embodiment. In addition, like in the second embodiment, the P-type buried diffusion area 4 is formed so as to make contact with the bottom of the body area 3 and extend to an area beneath the drain area 8. In addition, like in the third embodiment, there is an area where the buried diffusion area 4 is not formed beneath a part of the drain area 8.

In the case of the present embodiment, there is an N-type auxiliary diffusion area 13 having a higher concentration than the P-type buried diffusion area 4 beneath a part of the drain area 8. In addition, this auxiliary diffusion area 13 is formed so as to connect the drift area 5 and the well area 2 under the buried diffusion area 4, and thus, the well areas 2 formed over and under the buried diffusion area 4 so as to sandwich the buried diffusion area 4 are connected to the same potential.

Figure 16:
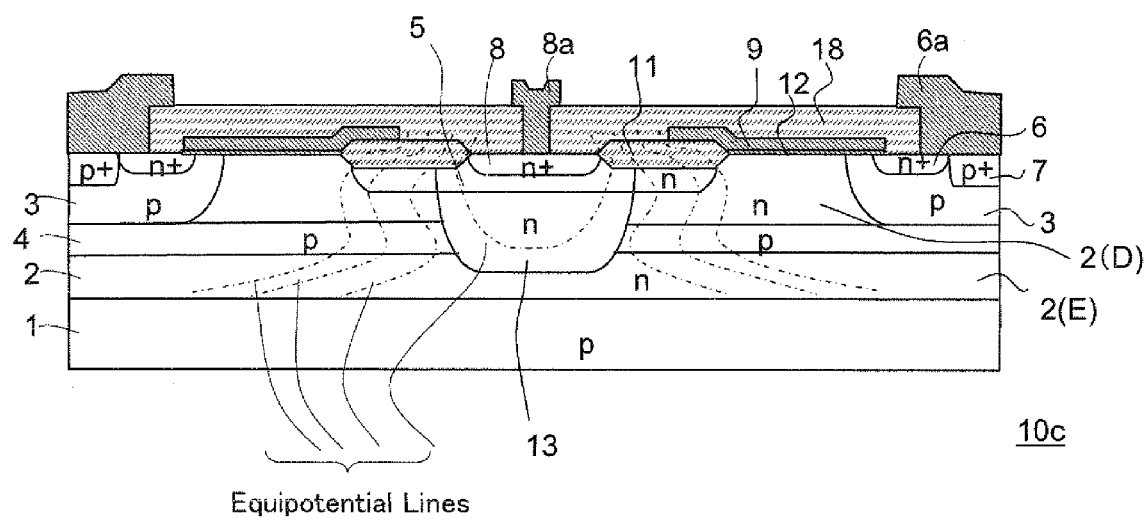
FIG. 16 is a diagram showing a state of equipotential lines in the case where a reverse bias is applied to the semiconductor device according to the fourth embodiment of the present invention.

FIG. 16 shows a part of equipotential lines in the case where the source electrode 6a and the gate electrode 9 are set at the GND and a positive voltage is applied to the drain electrode 8a in the device of the present invention 10c according to the present embodiment. As shown in FIG. 16, the potential of the area E is the same as the potential of the drain electrode 8a, and therefore, unlike the distribution in the potential in the device of the present invention 10a according to the second embodiment shown in FIG. 11, the electrical field is not concentrated in the border portion between the buried diffusion area 4 and the drain area 8. Therefore, like in the device of the present invention 10b according to the third embodiment, the withstand voltage of the device as a whole is not determined by the conditions for the withstand voltage in the border portion between the buried diffusion area 4 and the drain area 8, and thus, a semiconductor device having a higher withstand voltage than the second embodiment can be implemented.

In the device 10c of the present invention according to the present embodiment shown in FIG. 15, an auxiliary diffusion area 13 of a high concentration N-type is formed so as to penetrate through the P-type buried diffusion area 4. The auxiliary diffusion area 13 is formed so as to continue from the drift area 5, and therefore, the drift area is formed of the N-type area formed of the auxiliary diffusion area 13 and the drift area 5. Therefore, the end portion of the buried diffusion area 4 extends into the auxiliary diffusion area 13, and thus, the resistance within the drift area (that is, the drift resistance Rdrift) partially increases.

In the present embodiment, however, the auxiliary diffusion area 13 is formed in order to electrically connect the well areas 2 formed over and under the buried diffusion area 4 so as to sandwich the buried diffusion area 4 to the same potential as in the third embodiment. That is, the auxiliary diffusion area 13 may be localized within a part of the area beneath the drain area 8, or in other words, the buried diffusion area 4 may be formed of most of the portions beneath the drain area 8, as in the second embodiment.

In this case, the drift resistance Rdrift increases only in a small part of the area. Therefore, the on-resistance Ron as a whole can be greatly reduced in comparison with in the conventional configuration, as in the third embodiment. Accordingly, in the present embodiment, stable reduction in the on-resistance and increase in the withstand voltage can be achieved during the manufacturing process, irrespectively of the taper angle of the resist when impurity ions are implanted.

A manufacturing process for the device of the present invention 10c according to the present embodiment will be described below. FIGS. 17A to 17E are schematic cross-sectional diagrams showing the structure at each step in the manufacture of the device of the present invention 10c in accordance with the method of the present invention, and FIGS. 17A to 17E show the steps in order. In addition, FIG. 18 is a flow chart showing the manufacturing process in accordance with the method of the present invention according to the present embodiment, and the steps in the following description represent the steps in the flow chart shown in FIG. 18. Here, the method of the present invention according to the present embodiment is the same as the method of the present invention according to the second embodiment, except that an auxiliary diffusion area 13 is formed, and therefore, the same steps as the process steps according to the second embodiment are denoted by the same symbols, and the description thereof is simplified.

Figure 17A:
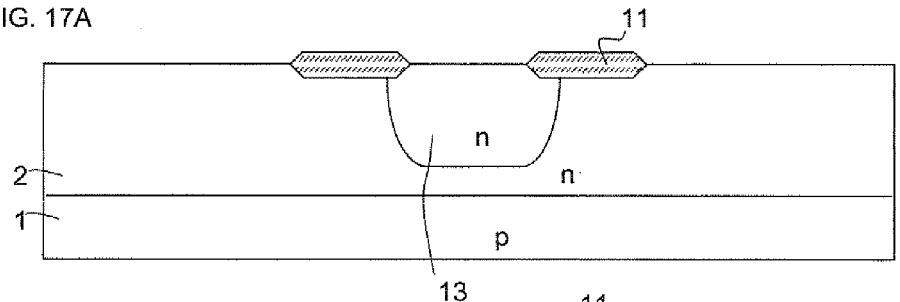
FIGS. 17A to 17E are schematic cross-sectional diagrams showing the structure at each step in a manufacture of the semiconductor device according to the fourth embodiment of the present invention.
Figure 18:
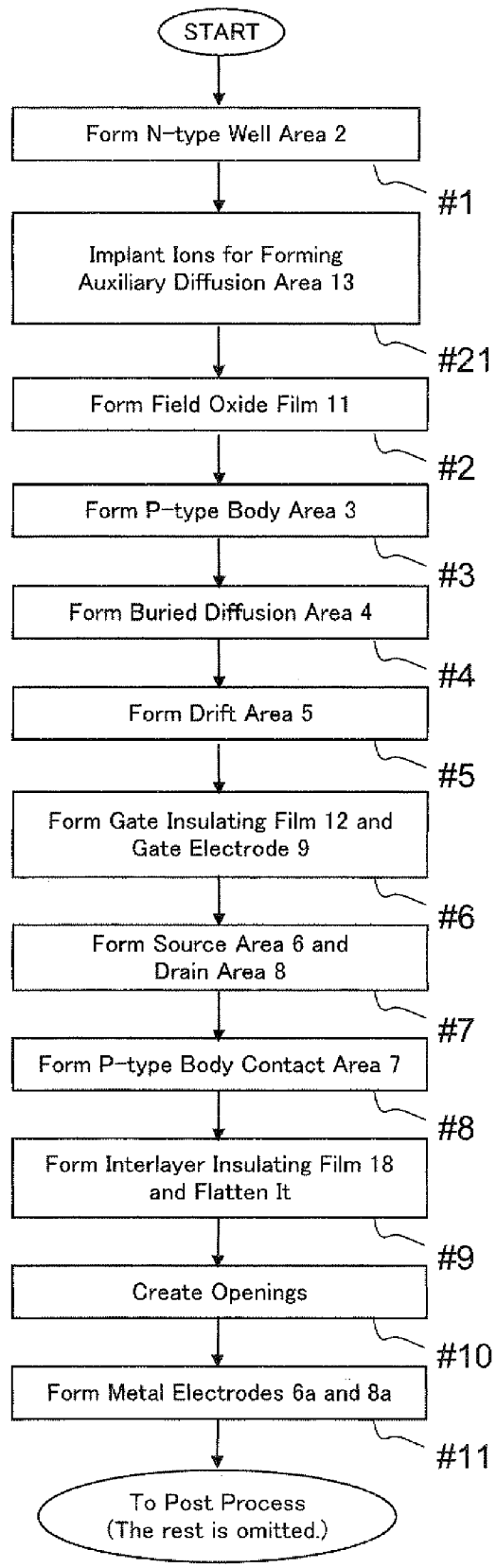
FIG. 18 is a flow chart illustrating the steps in the manufacture in order when the semiconductor device according to the fourth embodiment of the present invention is manufactured.
Figure 19:
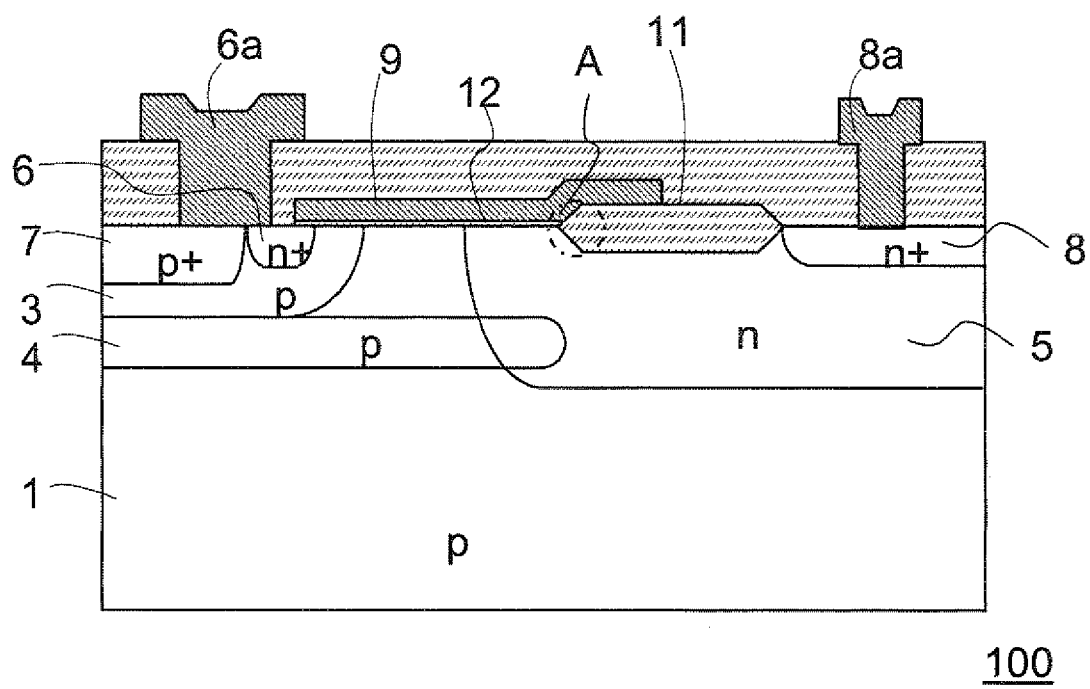
FIG. 19 is a schematic cross-sectional diagram showing the structure of a conventional LDMOS transistor.
Figure 20:
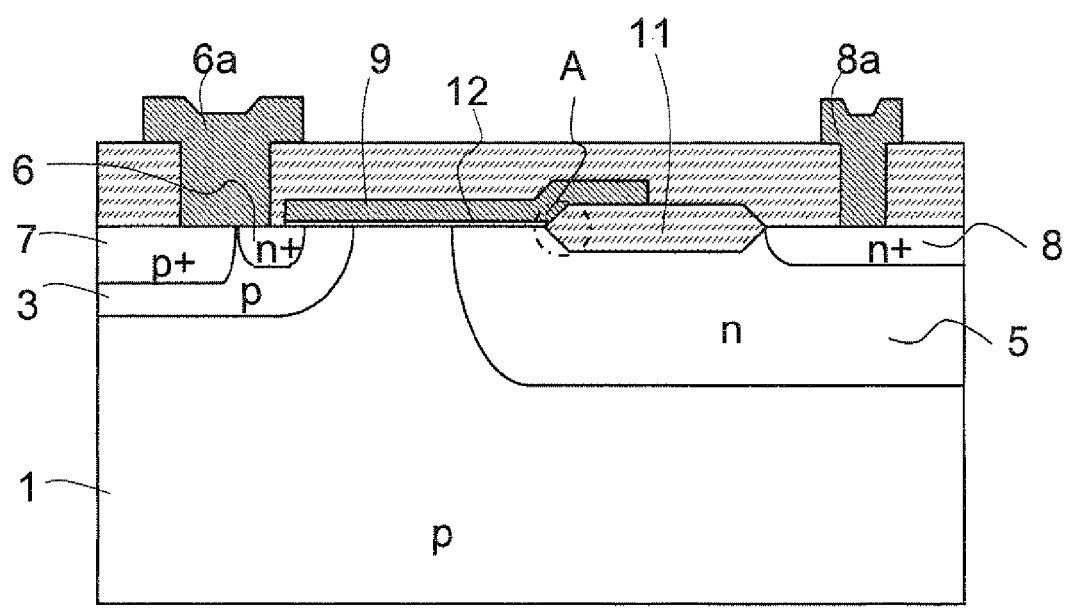
FIG. 20 is another schematic cross-sectional diagram showing the structure of a conventional LDMOS transistor.

First, as shown in FIG. 17A, N-type impurity ions are implanted in a P-type semiconductor substrate 1, and after that, an N-type well 2 is formed through thermal diffusion by means of high temperature drive-in (Step #1). After that, phosphorous ions of $1.0 \times 10^{13}/cm^2$ or higher are implanted in an area beneath the area where the drain area 8 is to be formed in a later step under such conditions that the bottom is positioned deeper than the buried diffusion area 4 to be formed in a later step, for example (Step #21). After that, a field oxide film 11 is formed in accordance with a publicly known LOCOS method (Step #2). When LOCOS is formed in Step #2, the impurity ions implanted in Step #21 diffuse through thermal diffusion, so that an auxiliary diffusion area 13 is formed in a desired area.

Figure 17B:
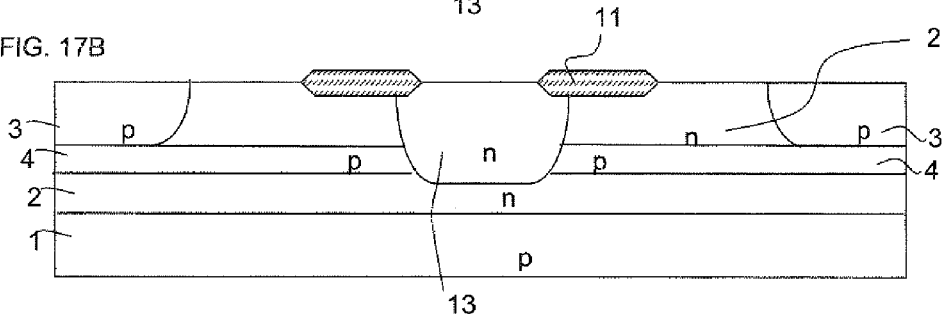

Next, as shown in FIG. 17B, P-type impurity ions (for example boron ions) are implanted thereby forming a P-type body area 3 (Step #3). At this time, ions are implanted by defining the area for the body area 3 using a resist mask so that the body area 3 is formed in annular form. After that, P-type impurity ions are implanted with high energy by defining the area for a P-type buried diffusion area 4 using a resist mask so that the area can extend beneath the area where the drain area 8 is to be formed in a later step, and thus, the P-type buried diffusion area 4 is formed (Step #4). As for the conditions for ion implantation in Step #4, boron ions are implanted with an implantation energy of 1 MeV or higher and a dose of $1.0 \times 10^{12}/cm^2$ or more, for example. At this time, the buried diffusion area 4 is formed so as to extend from the bottom of the body area 3 formed in annular form to the area surrounded by the body area 3. Here, in Step #4, ions are implanted with a smaller dose than in Step #21.

An N-type auxiliary diffusion area 13 having a higher concentration than the P-type buried diffusion area 4 is formed in advance in Step #21 in the present embodiment, and therefore, even after the formation of the buried diffusion area 4, the well areas 2 formed over and under the buried diffusion area 4 so as to sandwich the buried diffusion area 4 have the same potential as a result of the connection via the auxiliary diffusion area 13.

Figure 17C:
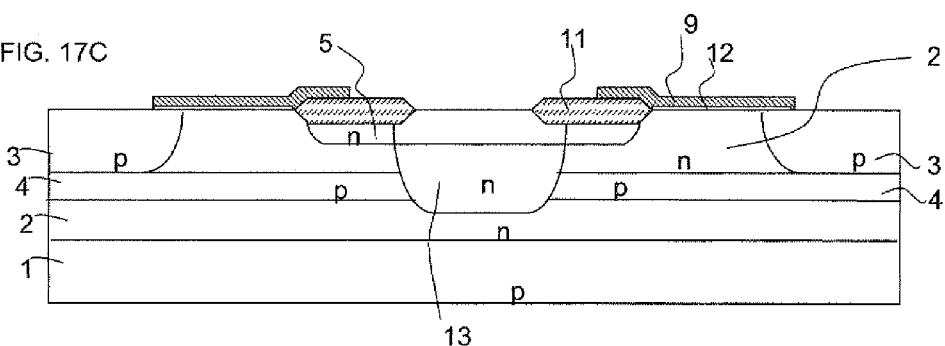

Next, as shown in FIG. 17C, N-type impurity ions are implanted in a position at a distance from the body area 3, and thus, a drift area 5 is formed (Step #5). Concretely, N-type impurity ions are implanted in a part of the area inside surrounded by the body area 3 formed in annular form. When Step #5 is carried out, the drift area 5 is formed so as to be surrounded by the body area 3. At this time, the drift area 5 is formed so as to be connected to the auxiliary diffusion area 13 formed in advance.

After that, a gate insulating film 12 is formed on the surface of the well area 2, and furthermore, a gate electrode 9 is formed so as to cover from the end portion on the drift area 5 side of the body area 3 to a part of the field oxide film 11 (Step #6).

Figure 17D:
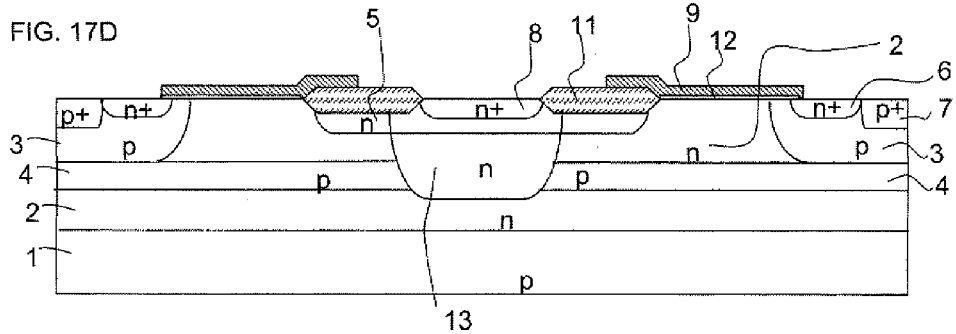

Next, as shown in FIG. 17D, high concentration N-type impurity ions (for example phosphorous ions or arsenic ions) are implanted in the body area 3 and the drift area 5 so that a source area 6 and a drain area 8 are formed within the body area 3 and the drift area 5, respectively (Step #7). Furthermore, high concentration P-type impurity ions (for example boron ions) are implanted in the body area 3 thereby forming a P-type body contact area 7 (Step #8). When Step #7 is carried out, the drain area 8 is formed so as to be surrounded by the source area 7 formed in annular form. At this time, the drain area 8, the drift area 5, the auxiliary diffusion area 13 and the well area 2 under the buried diffusion area 2 are electrically connected to each other so as to have the same potential.

Figure 17E:
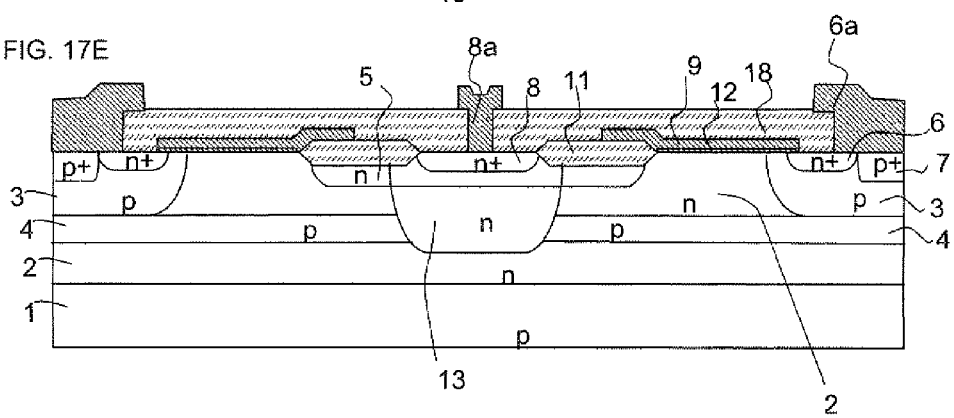

Next, as shown in FIG. 17E, an interlayer insulating film 18 is formed on the surface in accordance with a normal pressure CVD method, for example, and after that, a flattening process is carried out, so that the difference in level of the surface become smaller (Step #9). After that, contact etching is carried out on the interlayer insulating film 18 above the gate electrode 9, the drain area 8, the source area 6 and the body contact area 7, thereby creating respective openings (Step #10). After that, a conductive material film (for example an Al film) is grown in accordance with a sputtering method, for example and then patterned through photo etching and dry etching, thereby forming metal electrodes (6*a* and 8*a*) (Step #11). The device of the present invention 10*c* is gained through the above described steps.

As described above, the buried diffusion area 4 is formed so as to extend from the bottom of the body area 3 formed in annular form to a portion beneath the drain area 8 in an area surrounded by the body area 3 in annular form, and thus, a semiconductor device can be manufactured in which stable reduction in the on-resistance and increase in the withstand voltage can be achieved during the manufacturing process, irrespectively of the taper angle of the resist when impurity ions are implanted with high energy in Step #4. In addition, the auxiliary diffusion area 13 is formed in a portion beneath the drain area 8 so as to extend from the drift area 5 to a position deeper than the buried diffusion area 4, and therefore, the well areas 2 formed over and under the buried diffusion area 4 so as to sandwich the buried diffusion area 4 are electrically connected to the same potential. As a result, the electrical field is not concentrated in the border portion between the buried diffusion area 4 and the drain area 8, and thus, the withstand voltage of the device as a whole is not determined by the conditions for the withstand voltage in the border portion between the buried diffusion area 4 and the drain area 8, and therefore, a semiconductor device having a higher withstand voltage than the second embodiment can be implemented.

Other Embodiments

Other embodiments will be described below.

(1) Although in the embodiments, an N-type drift area 5 is formed, this area is a diffusion area in order to reduce the on-resistance of the LDMOS, and it is clear that the effects of the present invention can be gained without the N-type drift area 5. Here, it is preferable to form a drift area 5, as described above, in order to further reduce the on-resistance Ron.

(2) Although in the embodiments, an N-channel type LDMOS transistor having a P-type body area and N-type source and drain areas is formed on a P-type semiconductor substrate, a P-channel type LDMOS transistor having the same effects can be gained in the same manner by switching the polarities.

Figure 21:
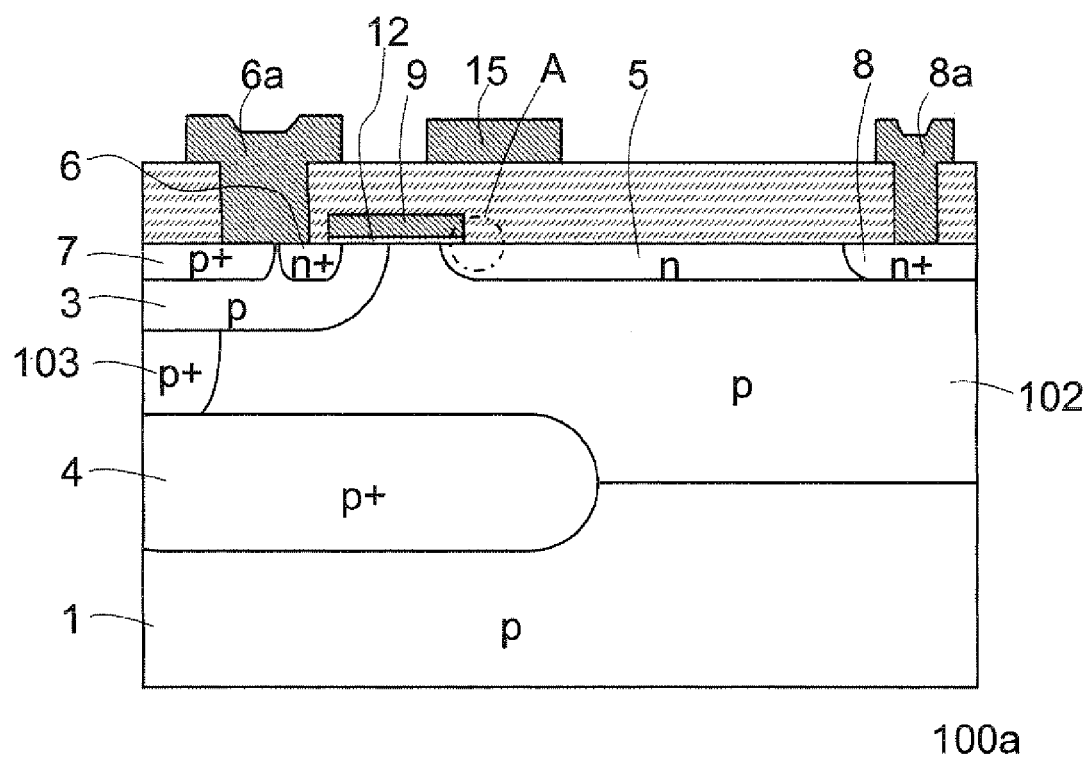
FIG. 21 is still another schematic cross-sectional diagram showing the structure of a conventional LDMOS transistor.
Figures 22A, 22B:
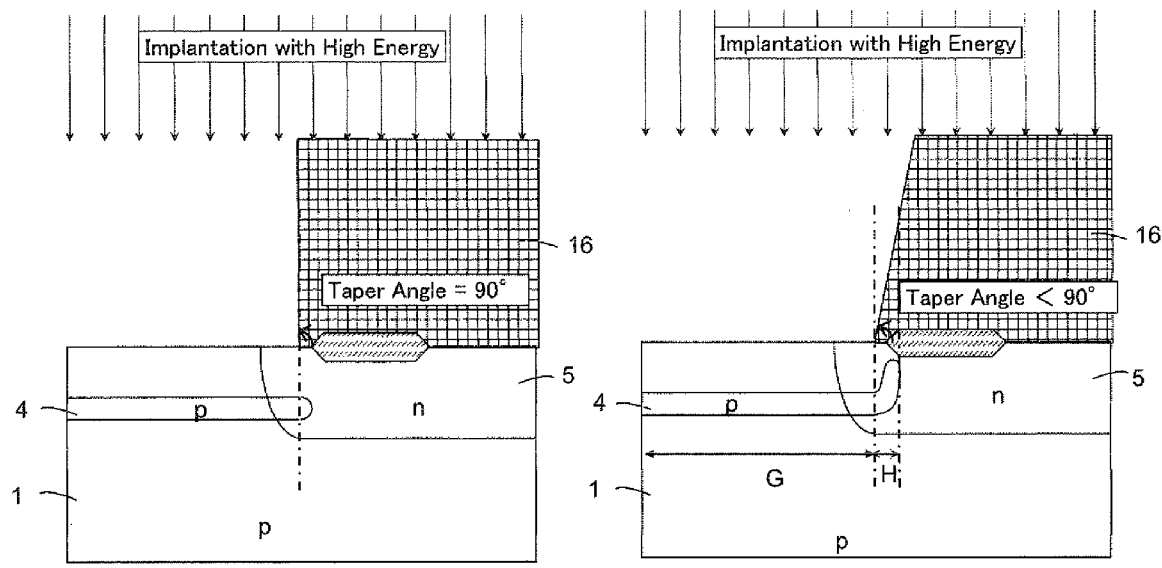
FIGS. 22A and 22B are schematic cross-sectional diagrams showing the structure of conventional LDMOS transistors when a buried diffusion area is formed.

(3) The embodiments may be modified so as to have a configuration where a conductive gate plate 15 is provided on the interlayer insulating film 18 over the gate electrode 9, as in FIG. 21.

(4) Although in the first embodiment, the drift areas 5 are formed so as to sandwich the body area 3, the drift area 5 may be formed so as to surround the outer periphery of the body area 3. At this time, the drain area 8 may also be formed so as to surround the outer periphery of the body area 3.

In addition, although in the second to fourth embodiments, a source area 6 is formed so as to surround the drain area 8, source areas 6 may be formed at a distance from each other so as to sandwich the drain area 8. In this case, the two source areas 6 may be electrically connected through a wiring layer in a higher layer.

(5) Although in the first embodiment, the source electrode 6*a* is formed so as to make contact with two areas: the source area 6 and the body contact area 7, electrodes separately connected to the two areas may be provided in the configuration.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor device comprising:
    a well area of a second conductivity type formed on a semiconductor substrate of a first conductivity type, the second conductivity type being different from the first conductivity type;
    a body area of the first conductivity type formed within the well area;
    a source area of the second conductivity type formed within the body area;

a drain area of the second conductivity type formed at a distance from the body area within the well area, the drain area having a higher concentration than the well area;

a gate insulating film formed so as to overlay a part of the body area;

a gate electrode formed on the gate insulating film; and a buried diffusion area of the first conductivity type which makes contact with a bottom of the body area and extends to an area beneath the drain area in a direction parallel to a surface of the semiconductor substrate within the well area, wherein the buried diffusion area is not formed beneath a part of the drain area which is a potential setting area, but formed beneath the other part of the drain area except the potential setting area and completely overlaps to the drain area except the potential setting area in the vertical direction to the substrate, so that an electric contact is made between the potential setting area and the well area below the buried diffusion area.

2. The semiconductor device according to claim 1, wherein the body area is formed so as to be sandwiched between two drain areas formed at a distance from each other.

3. The semiconductor device according to claim 1, wherein the body area is formed in annular form so as to surround the drain area.

4. The semiconductor device according to claim 3 further comprising
an auxiliary diffusion area of the second conductivity type formed beneath the potential setting area, the auxiliary diffusion area being electrically connected to the drain area, wherein
a bottom of the auxiliary diffusion area is deeper than a bottom of the buried diffusion area.

5. The semiconductor device according to claim 1 further comprising
a drift area of the second conductivity type within the well area, the drift area having a higher concentration than the well area and being at a distance from the body area, wherein
the drain area having a higher concentration than the drift area is formed within the drift area.

6. The semiconductor device according to claim 1, wherein a body contact area of the first conductivity type having a higher concentration than the body area is formed within the body area.

7. The semiconductor device according to claim 1, wherein the end portions of the buried diffusion area rise upward.

8. The semiconductor device according to claim 1, wherein the potential setting area is localized.

* * * * *